US009964846B2

(12) United States Patent
Geohegan et al.

(10) Patent No.: US 9,964,846 B2
(45) Date of Patent: May 8, 2018

(54) TWO-DIMENSIONAL HETEROSTRUCTURE MATERIALS

(71) Applicant: UT-Battelle, LLC, Oak Ridge, TN (US)

(72) Inventors: David B. Geohegan, Knoxville, TN (US); Christopher M. Rouleau, Knoxville, TN (US); Kai Wang, Oak Ridge, TN (US); Kai Xiao, Knoxville, TN (US); Ming-Wei Lin, Guilderland, NY (US); Alexander A. Puretzky, Knoxville, TN (US); Masoud Mahjouri-Samani, Knoxville, TN (US)

(73) Assignee: UT Battelle, LLC, Oak Ridge, TN (US)

( * ) Notice: Subject to any disclaimer, the term of this patent is extended or adjusted under 35 U.S.C. 154(b) by 0 days. days.

(21) Appl. No.: 15/215,389

(22) Filed: Jul. 20, 2016

(65) Prior Publication Data
US 2017/0025505 A1 Jan. 26, 2017

Related U.S. Application Data

(60) Provisional application No. 62/195,150, filed on Jul. 21, 2015.

(51) Int. Cl.
*H01L 21/337* (2006.01)
*G03F 1/20* (2012.01)
(Continued)

(52) U.S. Cl.
CPC .......... *G03F 1/20* (2013.01); *H01L 21/02568* (2013.01); *H01L 21/02664* (2013.01);
(Continued)

(58) Field of Classification Search
CPC .................................................. H01L 29/66431
(Continued)

(56) References Cited

U.S. PATENT DOCUMENTS 9,640,391 B2 * 5/2017 Yang ................. H01L 21/02568
2015/0064471 A1 * 3/2015 Dresselhaus ............ C23C 14/12
428/408

OTHER PUBLICATIONS

Butler, Sheneve Z. et al., "Progress, Challenges, and Opportunities in Two-Dimensional Materials Beyond Graphene," *ACS Nano* vol. 7, No. 4, pp. 2898-2926 (2013).
(Continued)

*Primary Examiner* — Chandra Chaudhari
(74) *Attorney, Agent, or Firm* — Brinks Gilson & Lione

(57) ABSTRACT

Methods, articles of manufacture and systems for creating new nanoscale two dimensional materials comprising designed arrays of lateral or vertical heterojunctions may be fabricated by first lithographically masking a 2D material. Exposed, or unmasked, regions of the 2D material may be converted to a different composition of matter to form lateral or vertical heterojunctions according to the patterned mask. PLD and high kinetic energy impingement of atoms may replace or add atoms in the exposed regions, and a plurality of the exposed regions may be converted concurrently. The process may be repeated one or more times on either side of the same 2D material to form any suitable combination of lateral heterojunctions and/or vertical heterojunctions, comprising semiconductors, metals or insulators or any suitable combination thereof. Furthermore, the resulting 2D material may comprise p-n, n-n, p-p, n-p-n and p-n-p junctions, or any suitable combination thereof.

19 Claims, 13 Drawing Sheets
(11 of 13 Drawing Sheet(s) Filed in Color)

(51) Int. Cl.
    H01L 21/033   (2006.01)
    H01L 21/02    (2006.01)
    H01L 29/06    (2006.01)
    H01L 29/24    (2006.01)
    H01L 29/735   (2006.01)
    H01L 29/778   (2006.01)
    H01L 29/16    (2006.01)

(52) U.S. Cl.
    CPC ...... *H01L 21/0332* (2013.01); *H01L 29/0661* (2013.01); *H01L 29/24* (2013.01); *H01L 29/1606* (2013.01); *H01L 29/735* (2013.01); *H01L 29/778* (2013.01)

(58) Field of Classification Search
    USPC .......................................................... 438/191
    See application file for complete search history.

(56) References Cited

OTHER PUBLICATIONS

Chhowalla, Manish et al., "The Chemistry of Two-Dimensional Layered Transition Metal Dichalcogenide Nanosheets," *Nature Chem.* vol. 5, pp. 263-275 (2013).

Coleman, Jonathan N. et al., "Two-Dimensional Nanosheets Produced by Liquid Exfoliation of Layered Materials," *Science* vol. 331, Feb. 2011, pp. 568-571.

Duan, Xidong et al., "Lateral Epitaxial Growth of Two-Dimensional Layered Semiconductor Heterojunctions," *Nature Nanotechnology* vol. 9, Dec. 2014, pp. 1024-1030.

Duesberg, Georg S., "Heterojunctions in 2D Semiconductors: A Perfect Match," *Nature Materials* vol. 13, Dec. 2014, pp. 1075-1075.

Gong, Yongji et al., "Vertical and In-Plane Heterostructures From $WS_2/MoS_2$ Monolayers," *Nature Materials* vol. 13, Dec. 2014, pp. 1135-1142.

Huang, Chunming et al., "Lateral Heterojunctions Within Monolayers $MoSe_2$—$Wse_2$ Semiconductors," *Nature Materials* vol. 13, Dec. 2014, pp. 1096-1101.

James, Philip B. et al., "The Crystal Structure of $MoSe_2$," *Acta Crystallogr* vol. 16, (1963), p. 1183.

Kang, Jun et al., "Monolayer Semiconducting Transition Metal Dichalcogenide Alloys: Stability and Band Bowing," *J. of Appl. Physics*, vol. 113, 2013, (7p).

Kappera, Rajesh et al., "Phase-Engineered Low-Resistance Contacts for Ultrathin $MoS_2$ Transistors," *Nature Materials* vol. 13, Dec. 2014, pp. 1128-1134.

Komsa, Hannu-Pekka et al., "Two-Dimensional Transition Metal Dichalcogenide Alloys: Stability and Electronic Properties," *J. Phys. Chem. Lett.* vol. 3, 2012, pp. 3652-3656.

Levendorf, Mark P. et al., "Graphene and Boron Nitride Lateral Heterostructures for Atomically Thin Circuitry," *Nature*, vol. 488, Aug. 2012, pp. 627-632.

Li, Hai et al., "Preparation and Applications of Mechanically Exfoliated Single-Layer and Multilayer $MoS_2$ and $WSe_2$ Nanosheets," *ACS Publications Acc. Chem. Res.* vol. 47, 2014, pp. 1067-1075.

Li, Honglai et al., "Growth of Alloy $MoS_{2x}Se_{2(1-x)}$ Nanosheets with Fully Tunable Chemical Compositions and Optical Properties," *J. Am. Chem. Soc.*, vol. 136, 2014, pp. 3756-3759.

Lowndes, Douglas, H. et al., "Synthesis of Novel Thin-Film Materials by Pulsed Laser Deposition," *Science* vol. 273, Aug. 1996, pp. 898-903.

Mahjouri-Samani, Masoud et al., "Pulsed Laser Deposition of Photoresponsive Two-Dimensional GaSe Nanosheet Networks," *Advanced Functional Materials* vol. 24, 2014, pp. 6365-6371.

Mahjouri-Samani, Masoud et al., "Digital Transfer Growth of Patterned 2D Metal Chalcogenides by Confined Nanoparticle Evaporation," *ACS Nano*, vol. 8, No. 11, 2014, pp. 11567-11575.

Najmaei, Sina et al., "Vapour Phase Growth and Grain Boundary Structure of Molybdenum Disulphide Atomic Layers," *Nature Materials* vol. 12, Aug. 2013, pp. 754-759.

Nayak, A.P., "Pressure-Dependent Optical and Vibrational Properties of Monolayer Molybdenum Disulfide," *Nano Letter* vol. 15, 2015, pp. 346-353.

Perkins, F.K. et al., "Chemical Vapor Sensing with Monolayer $MoS_2$," *ACS Nano Letter.* vol. 13, 2013, pp. 668-673.

Pradhan, Nihar R., "Ambipolar Molybdenum Diselenide Field-Effect Transistors: Field-Effect and Hall Mobilities," *ACS Nano* vol. 8, No. 8, 2014, pp. 7923-7929.

Su, Sheng-Han et al., "Controllable Synthesis of Band-Gap-Tunable and Monolayer Transition-Metal Dichalcogenide Alloys," *Frontiers in Energy Research* vol. 2, Article 27, Jul. 2014, pp. 1-8.

Sundaram, R.S. et al., "Electroluminescence in Single Layer $MoS_2$," *ACS Publications Nano Letter*, vol. 13, 2013, pp. 1416-1421.

Tsai, Meng-Lin et al., "Monolayer $MoS_2$ Heterojunction Solar Cells," *ASC Nano* vol. 8, No. 8, 2014, pp. 8317-8322.

Wang, Xingli et al., "Chemical Vapor Deposition Growth of Crystalline Monolayer $MoSe_2$," *ACS Nano* vol. 8, No. 5, 2014, pp. 5125-5131.

Young, P.A., "Lattice Parameter Measurements on Molybdenum Disulphide," British Journal of Applied Physics vol. 1, Ser.2, 1968, pp. 936-939.

Zeng, Qingsheng et al., "Band Engineering for Novel Two-Dimensional Atomic Layers," *Small-Journal* vol. 11, No. 16, 2015, pp. 1868-1884.

Zheng, Jian et al., "High Yield Exfoliation of Two-Dimensional Chalcogenides Using Sodium Naphthalenide," *Nature Communications* 5:2995 DOI: 10.1038 (7p).

\* cited by examiner

TWO-DIMENSIONAL HETEROSTRUCTURE MATERIALS

CROSS REFERENCES TO RELATED APPLICATIONS

This patent application makes reference to and claims priority to U.S. Provisional Patent Application Ser. No. 62/195,150, filed on Jul. 21, 2015, which is hereby incorporated by reference in its entirety.

STATEMENT REGARDING FEDERALLY FUNDED RESEARCH AND DEVELOPMENT

The United States Government has rights in this invention pursuant to contract no. DE-AC05-00OR22725 between the United States Department of Energy and UT-Battelle, LLC.

BACKGROUND OF THE INVENTION

1. Technical Field

This disclosure relates generally to two dimensional (2D) electronic materials. Specifically, the disclosure pertains to the synthesis and patterning of 2D materials in controlled configurations for devices.

2. Related Art 2D nanostructure materials are the latest in a long line of useful materials that hold great promise for high-density electronics. Because of their nanoscale dimensions, electrons become quantum confined within and imbue these 2D nanostructures with unique new properties. Zero dimensional (0D) nanostructure materials such as quantum dots exhibit new luminescence and absorption bands as sizes become small. One dimensional (1D) nanostructure materials such as carbon nanotubes and semiconductor nanowires, for example, of Si, are known as quasi-1D materials with excellent conductivity (metallic) or semiconducting properties. Other nanostructure materials, such as boron nitride are excellent insulators. However, wiring such 0D and 1D nanostructure materials to fabricate integrated circuits may present significant problems.

2D materials with nanoscale thickness, for example, graphene, boron nitride, metal chalcogenides and others, are produced from layered materials (e.g. graphite, BN and MoS2) that have been reduced to one, or a few atoms, thick. These nanoscale thickness materials are highly desirable, often yielding new properties. Graphene may remain metallic in a single-layer form, such that semiconducting properties needed to make transistors are missing in graphene. However, metal chalcogenides are mostly semiconducting, and come in a great variety. 2D nanostructure material families may be synthesized, and may be utilized in metals, insulators, and semiconductors. The beauty of these materials is that they have quantum properties, and are essentially thin films—very thin, but nevertheless a thin film.

Chemical vapor deposition (CVD) growth poses a challenge when attempting to make 2D crystals of electronic-grade monolayers or few layered semiconductors with large areas. For graphene, millimeter sized hexagonal or square crystals may be grown. For the metal chalcogenides, typically a few to 10-20 microns, or 100 micron-sized triangular crystals may be grown. The field follows the synthesis of graphene, which followed the synthesis of nanotubes. Tube furnaces are typically used with vaporized reactants, which self-assemble on various substrates. For graphene, the substrates are metals at 500-1000 C. For metal chalcogenides, the substrates are typically oxides at ~500-900 C. In both cases, the crystals are sometimes attached epitaxially and covalently to the substrate, but in most cases the crystals float on the substrates held only by (strong) van der Waals forces. These crystals may be removed by dissolving the substrate. Then the crystals (held onto a piece of polymer film) may be stamped on top of one another, and the polymer may then be dissolved away. In this way, vertical junctions may be made between two semiconductors, or a metal (graphene) and semiconductor, etc.

For semiconductors, p-n junctions may be used to make diodes and gated transistors, etcetera. For example, a p-n junction may comprise p-doped semiconductor and an n-doped semiconductor, or junctions may comprise two different p-type or different n-type semiconductors. However, it is difficult to grow two types of semiconductors together, laterally, to make multiple heterojunctions, which may be utilized in applications such as quantum wells. Repeating growth steps may pose a problem since each material has an optimum growth temperature, and at higher temperatures, CVD growth may evaporate away materials, for example, metal chalcogenides may lose their chalcogen atoms.

BRIEF SUMMARY OF THE INVENTION

A method, article of manufacture and system are provided for creating new compositions of matter. In a two dimensional material comprising a first composition of matter, lateral heterojunctions may be fabricated by first specifying a lithographic pattern for masked and exposed areas over the two dimensional material. A mask, for example $SiO_2$ thin film, may then be deposited onto a planar surface of the two dimensional material in selected areas according to the specified lithographic pattern of masked and exposed areas. The exposed, or unmasked regions of the two dimensional material may be converted to a second composition of matter to form lateral heterojunctions comprising the first composition of matter and the second composition of matter according to the specified pattern, where a plurality of the exposed regions may be converted concurrently. The two dimensional material may comprise one or more crystalline layers, one or more organic or inorganic amorphous layers, or a mixture of crystalline and organic or inorganic amorphous layers. A two dimensional crystalline material may comprise a monolayer, bilayer or trilayer crystal, for example. The process of specifying a pattern, depositing a lithographic mask according to the specified pattern and converting exposed regions to a different composition of matter may be repeated one or more times on either side of the same two dimensional material to form any suitable combination of lateral heterojunctions and/or vertical heterojunctions, where the heterojunctions may comprise semiconductors, metals insulators or a combination thereof. Furthermore, the repetitions of these processing steps performed on the same two dimensional material may yield a two dimensional material comprising p-n, n-n, p-p, n-p-n and p-n-p junctions or any suitable combination thereof.

A 2D material or composition of matter formed by the process, or by repeating the process, of specifying the pattern, depositing the lithographic mask according to the pattern and converting the exposed regions to a different composition of matter may be referred to as a new or different 2D material or composition of matter or as a subsequent or child generation 2D material or composition of matter.

In some embodiments, the two dimensional (2D) material may comprise a crystalline transition metal dichalcogenide (TMD), and either of the constituent metal or chalcogenide atoms may be replaced within a lattice structure of the two dimensional nanostructure crystal during the conversion process. For example, $MoSe_2$ may be converted to $MoS_2$, $MoSe_{2-x}S_x$, $Mo_{1-x}W_xSe_2$, or $WSe_2$ to form the lateral or vertical heterojunctions. In addition, the vacancy level of the TMD may be adjusted during the conversion process. For example, $MoSe_2$ may be converted to $MoSe_{2-x}$, in order to change the carrier type in the exposed region.

Other methods, compositions of matter, manufactures, systems, features and advantages will be, or will become, apparent to one with skill in the art upon examination of the following figures and detailed description. It is intended that all such additional methods, compositions of matter, manufactures, systems, features and advantages be included within this description, be within the scope of the invention, and be protected by the following claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The system may be better understood with reference to the following drawings and description. Non-limiting and non-exhaustive descriptions are described with reference to the following drawings. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
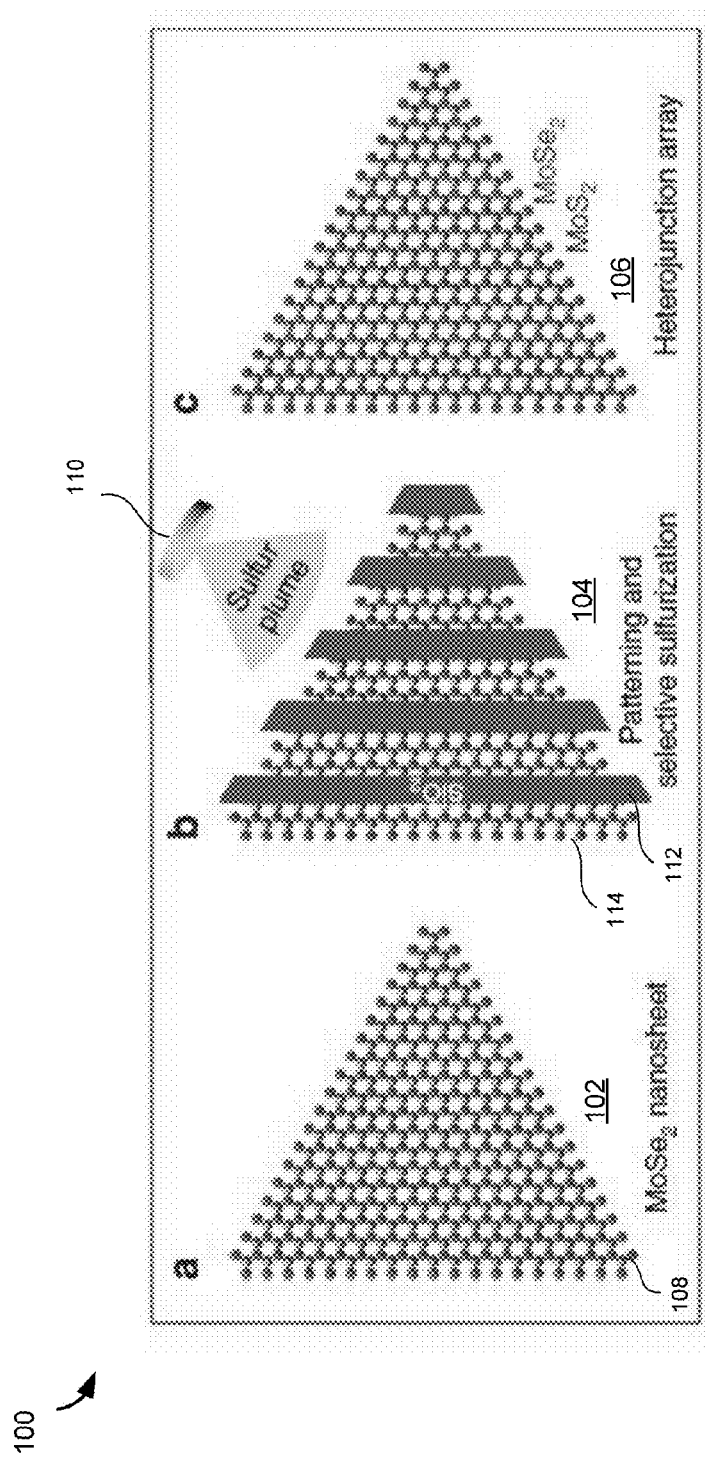
FIG. 1 illustrates exemplary stages of a two dimensional (2D) crystalline nanosheet undergoing a process that synthesizes lateral heterojunctions in a lithographically patterned array within the crystalline nanosheet.

High density integration of semiconductor heterojunctions forms the foundation of modern electronics and optoelectronics. Methods for deterministically producing lateral heterojunctions in two-dimensional crystal nanostructures may lead the way in the advancement of next-generation electronics.

Lateral heterojunctions may be synthesized in lithographically patterned arrays over a two-dimensional nanostructure crystal by selectively converting exposed regions of the nanostructure crystal from a first composition of matter into a different composition of matter. The amount of matter converted, or doping level, within the exposed regions may be varied with precision. The host nanostructure crystal, before and after the conversion process, may comprise a two dimensional monolayer or few-layer crystal, such as bilayer or trilayer lattice structure, all of which may be referred to as a nanosheet or nanostructure.

The shapes and stoichiometry of designed patterned regions and lateral heterojunctions across a nanosheet may be fabricated in a precisely controlled manner and may form simple to complex two-dimensional patterns of materials with specified electronic and optoelectronic properties. With this scalable and flexible process, any suitable shapes, patterns and compositions of matter may be fabricated to produce the lateral heterojunctions within the two-dimensional crystal nanostructures. Furthermore, multiple selected regions that may be located within a single two dimensional nanosheet may be converted simultaneously to create a plurality of sharp lateral heterojunction boundaries. These lateral heterojunctions may include, for example, p-n, n-n or p-p junctions among the regions of different semiconductor materials, and may serve as two dimensional "building blocks" for producing dense, ultrathin electronic devices in countless applications including flexible electronics to solar panels. Moreover, the process for forming the lateral heterojunction arrays within a 2D crystalline nanostructure may be extended to include materials with semiconductor, metallic and/or insulating properties.

A method, article of manufacture and system are provided for creating new compositions of matter in 2D materials. 2D Materials, of which a subset are 2D layered materials, are materials comprising of a single layer of atoms (e.g. graphene, boron nitride) or multiple layers of atoms (e.g. $MoS_2$ naturally forms a crystalline monolayer 3 atoms thick) that may be covalently bonded within each layer, and each layer may weakly bond to other layers forming double or multi-layer systems (e.g. a $MoS_2$ bilayer consists of two 3-layer monolayers weakly bonded and separated by van der Waals forces). In general, the atomic structure of these 2D materials may be in the form of ordered crystalline, disordered amorphous, or combination of both. Electrons in these 2D materials are free to move in the 2D plane, but their motion in the third direction may be restricted due to the confinement effect governed by quantum mechanics, giving rise to new properties.

The many atomistic variants of bilayer crystals each comprise different compositions of matter (as do trilayers, etc. . . . ) due to the various ways that the atoms overlap between the layers as determined by their stacking orientation. This atomistic stacking determines the band structure, and can result in an indirect band gap for one stacking vs. a direct band gap for another stacking for instance. Such differences can be manifested in the photoluminescence spectrum of the material or the electronic transport properties which can be measured and correlated with atomic-resolution TEM images of the materials. The atomistic orientations can also be revealed by the Raman spectroscopy of the bilayers or trilayers and the low-frequency "fingerprint" of each particular orientation, since the interatomic coupling that holds the layers in an overall van der Waals contact can be calculated, and summed, and compared to the vibrational shear modes and breathing modes between the layers that are experimentally measured. Thus each stacking results in a new structure, and new properties for each. Therefore, each bilayer, even of a single material, can be regarded as a unique composition of matter depending on its relative stacking orientation. As the number of layers increases, the complexity and number of compositions also increases. Typically, for a single material and known bulk stacking, the properties of few-layered materials significantly differ from that of the bulk when the number of layers <6, as a rule of thumb. For different types of materials, each forms a unique composition, an artificial heterostructure which is yet to be explored.

It is important to note that as-synthesized layers inherently have defects, including missing atoms (vacancies or voids), substituted or inserted atoms (dopants and point defects), and grain boundaries. This heterogeneity leads to new properties, and an additional level of complexity and opportunity for controlling properties. Controlling the type and level of defects in the two-dimensional crystals is as important as in typical three-dimensional crystals, where such techniques of doping have been used to control the carrier type and conductivity for many years, although the mechanisms of doping and type of defects are different in 2D crystals. We have recently shown that metal dichalcogenides with variable levels of vacancies, or with different levels of substitutional chalcogen or metals, can change the carrier type and conductivity of a monolayer. Thus, heterogeneous (e.g. voids, alloys) 2D monolayers, bilayers, are each different compositions of matter both structurally, as well as the resultant properties. Such heterogeneity in the level and type of defects can make the 2D materials more robust, or more sensitive to processing techniques such as electron, ion, or plasma processing as well as chemical processing techniques, such as etching. Tunably creating or healing these defects by processing techniques can form new compositions of matter, allowing tunable properties.

Because the top and bottom surfaces of 2D nanostructure crystals also interact with their adjoining medium, such adjoining layers have been shown to alter the "dielectric environment" of the crystals, resulting in a perturbation of their measured electronic properties (e.g., photoluminescence wavelength, intensity) (e.g., Raman spectral position, intensity). Gases, liquids, and solids of all types have shown these effects. By interacting with the topmost and bottom-most layers of a 2D crystal stack, and influencing the atoms on the top and bottoms, such layers essentially perturb the electronic interactions between the layers, resulting conversely in a change in structure of the original material. Hence, the substrate and encapsulation media (interacting with the bottom-most and topmost layers of a 2D material) may be considered as an element in the composition of matter, since they determine the structure and properties of the overall 2D crystal. Intentional addition of an adsorbed layer of pi-bonded organic small molecules, for example, are an example of a class of organic 2D layer which, when added to an inorganic 2D layered stack, form a hybrid 2D crystal.

Thus the composition and stacking orientation of the different layers, their levels of defects, and the similar properties of the substrate and encapsulation layers each determine the overall two dimensional material composition of matter and properties. Physical methods to process these structures and change their properties involving high-kinetic energy plasmas, ions, electrons, neutrals, neutrons, protons, photons, etc. may utilize these layers as processing tools. For example, a particular substrate may be chosen as a support, or an overlayer may be applied to the upper surface of the layers, to insulate, enhance, or chemically modify the interactions of such beams with the substrate, overlayer, or the adjoining layer(s), to result in controllable or enhanced conversion of the two dimensional material.

The conversion of the composition of matter that is defined by the two dimensional material, and associated substrate (if any) and overlayer (if any), is defined as a change in chemical bonding within the composite structure induced by the processing step(s) involved in the conversion method. These may include, but are not limited to:

1) addition or removal of point defects such as vacancies, substitutional dopants, etc.
2) induced grain boundaries
3) changes in van der Waals bonding between layers in a layered material resulting, for example, from a change in dielectric screening induced by the addition or modification of the substrate or overlayer, physical force, electrically or chemically applied charges.

FIG. 1 illustrates exemplary stages of a 2D crystalline nanosheet undergoing a process that synthesizes lateral heterojunctions in a lithographically patterned array within the crystalline nanosheet. Referring to FIG. 1, there is shown a 2D crystalline nanosheet 108 at three stages of a conversion process including stage 102, stage 104 and stage 106. Also shown are masked regions 112, exposed regions 114 and a target and a plume of deposition material 110.

A process for converting one composition of matter into another composition of matter combined with lithographic patterning of 2D materials may yield multiple lateral heterojunctions within a single 2D material. The process may begin at stage 102 with a host crystalline nanosheet 108 comprising a first composition of matter. The host crystalline nanosheet 108 may be coupled to a substrate, for example, by van der Wales forces. In some embodiments, the first composition of matter may include the substrate. In some embodiments, the substrate may comprise Si or $SiO_2$, for example.

At stage 104 the masked regions 112 may be lithographically applied to the host crystalline nanosheet 108 forming a specified 2D pattern comprising the masked regions 112 and the exposed regions 114 of the host's first composition of matter. Although a striped pattern is shown in FIG. 1, the disclosure is not limited with respect to any specific pattern and any suitable or arbitrary pattern may be formed or applied on the host crystalline nanosheet 108.

A second composition of matter may be deposited by converting the exposed regions 114 of the host's first composition of matter using the target and plume of deposition material 110. The atoms of the plume may replace the atoms in the first composition of matter within a lattice structure of the exposed regions 114 or may add (or remove) atoms in the exposed regions 114. Such replacement of atoms or addition/subtraction of atoms converts the exposed regions 114 into a different material and thereby synthesizes lateral heterojunctions at the boundaries of the masked and exposed regions of the first composition of matter and regions of the second composition of matter, according to the specified 2D lithographic pattern of masked and exposed regions 112 and 114. In this manner, a plurality of exposed regions 114 of the first composition of matter in the host crystal 108 may be simultaneously converted to the second composition of matter. At stage 106, the lithographic mask may be removed to reveal a new overall composition of matter including the synthesized lateral heterojunctions of the crystalline nanosheet 108 in the specified lithographically patterned array.

In one embodiment, at stage 102, the host crystalline nanosheet 108 may comprise a 2D monolayer lattice structure populated with a transitional metal dichalcogenide, for example, molybdenum diselenide ($MoSe_2$). The $MoSe_2$ crystalline nanosheet 108 may be lithographically masked, for example, with $SiO_2$, to form a desired 2D pattern of masked regions 112 and exposed regions 114 across the $MoSe_2$ crystalline nanosheet 108. The unmasked or exposed regions 114 of the $MoSe_2$ crystalline nanosheet 108 may be converted to a different TMD material, for example, molybdenum disulfide ($MoS_2$) to form a plurality of lateral n-n semiconductor heterojunctions across the nanosheet 108. Other combinations of TMDs may be utilized in a similar or same process to form lateral heterojunctions in a variety of electrical conduction properties, for example, lateral p-n, p-p and n-n junctions may be synthesized. In one such embodiment, a 2D host crystalline nanosheet made of Tungsten diselenide ($WSe_2$) may be lithographically patterned with a mask, and the unmasked or exposed regions of the pattern may be converted to Tungsten disulfide ($WS_2$) to form an array of semiconductor p-n junctions across the 2D host nanosheet according to the pattern.

Species of the transitional metal dichalcogenide (TMD) family may be expressed in the form of $MX_2$, where: M=Mo, W or Nb atoms; and X=S, Se or Te atoms. A TMD monolayer crystalline nanosheet may include a plane of M atoms sandwiched between two planes of X atoms. However, in some embodiments, the 2D nanosheets may comprise few-layer nanosheets, for example, bi-layers or tri-layers of 2D TMD crystal structures having a nanometer scale thickness. High-quality 2D monolayer or few-layer TMD crystals may be obtained utilizing various techniques such as mechanical cleavage, chemical exfoliation, vapor phase transport and laser-based methods. Such TMD crystals notably have electronic and optoelectronic properties that may be utilized in new generations of flexible field-effect transistors, photovoltaics, light emitting diodes, and sensors, for example. However, the disclosure is not limited with respect to any specific type of 2D material to be used as the host material, and any suitable 2D material may be utilized to synthesize the lateral heterojunctions using an applied mask.

Figure 2:
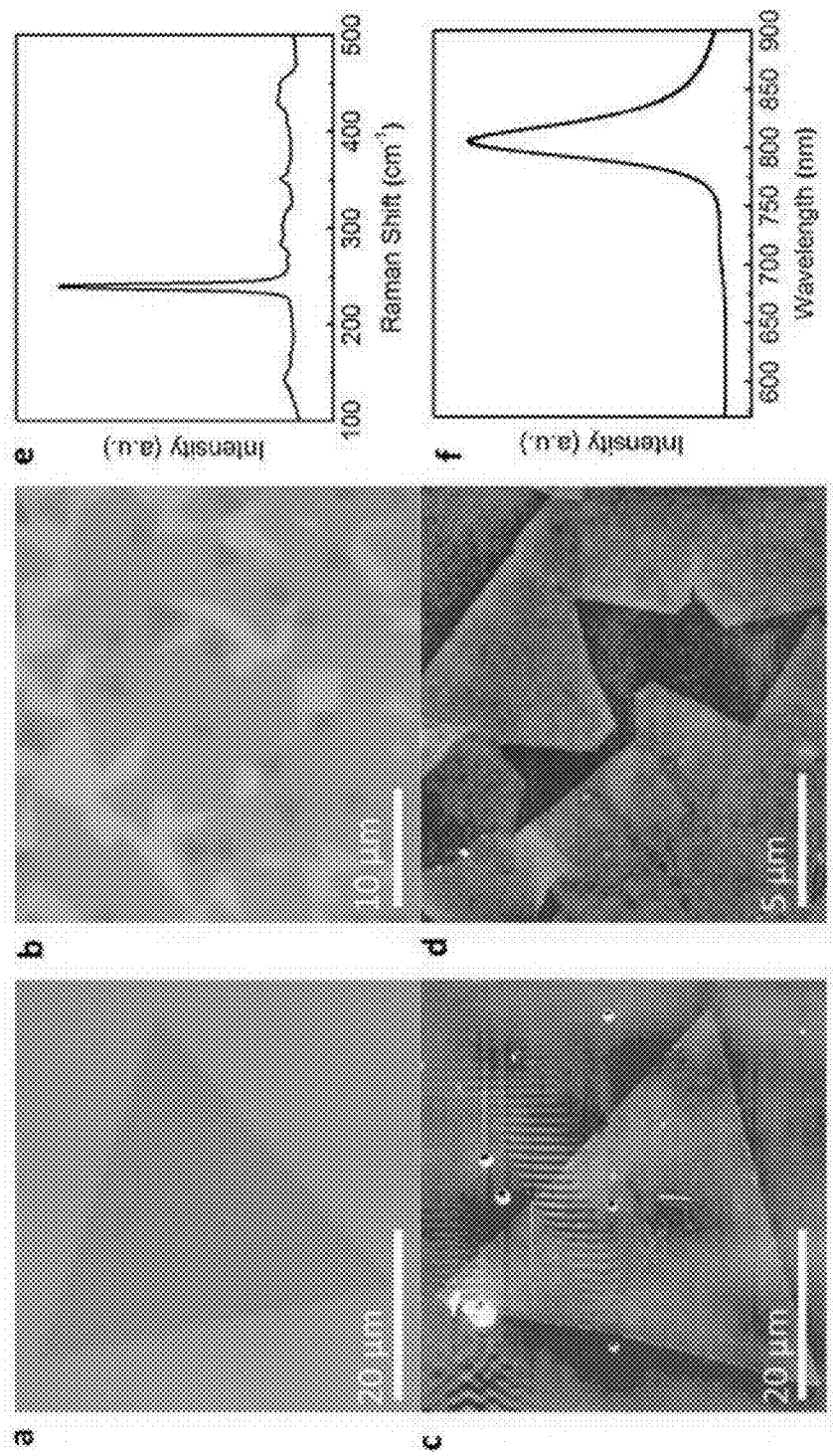
FIG. 2 is a set of images and characterization charts comprising exemplary molybdenum diselenide ($MoSe_2$) monolayer nanosheets for use in synthesizing patterned lateral heterojunctions.

FIG. 2 is a set of images and characterization charts comprising exemplary molybdenum diselenide ($MoSe_2$) monolayer nanosheets that may be used in synthesizing patterned lateral heterojunctions. The exemplary $MoSe_2$ nanosheets may have lateral sizes ranging within 10-100 µm. Atomic force microscopy (AFM) images a-b and optical images c-d represent isolated and merged monolayer $MoSe_2$ nanosheets that may be grown for use as a crystalline nanosheet 108 in the lateral or vertical heterojunction syntheses processes. Images e and f include corresponding Raman and photoluminescence (PL) spectra indicating the $E^1_{2g}$ Raman mode of $MoSe_2$ at 238 $cm^{-1}$ and a PL peak at 805 nm.

Figure 3:
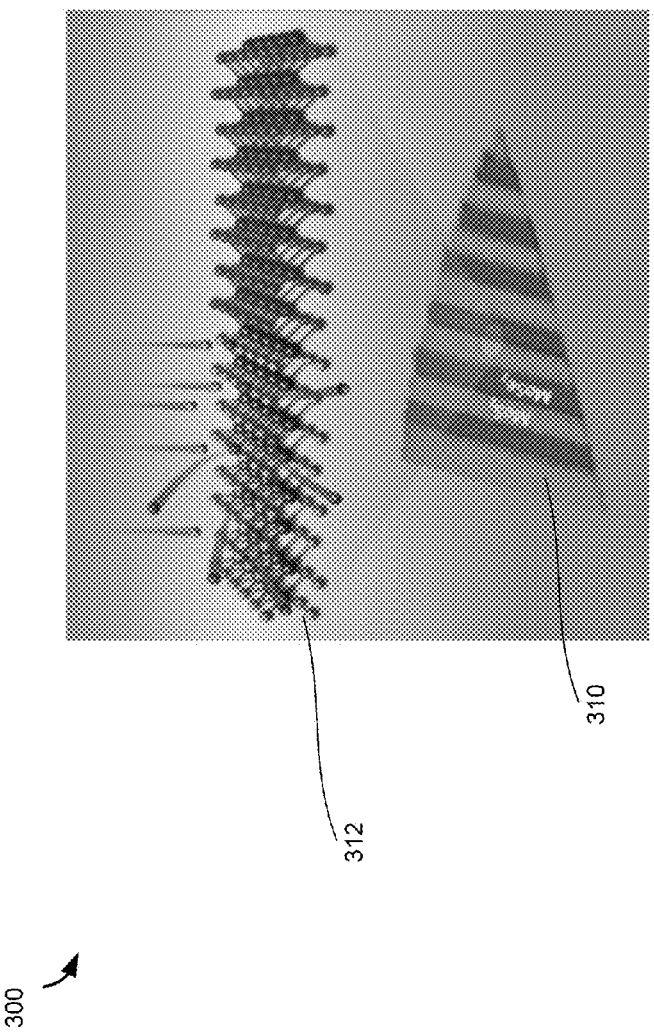
FIG. 3 is an illustration of an exemplary lithographically patterned array comprising $MoSe_2$ to $MoS_2$ heterojunctions in a crystalline monolayer, and a detail of a heterojunction within the array illustrating an edge view of the crystalline monolayer.

FIG. 3 is an illustration of an exemplary lithographically patterned array comprising $MoSe_2$ to $MoS_2$ heterojunctions in a crystalline monolayer, and a detail of a heterojunction within the array illustrating an edge view of the crystalline monolayer. Referring to FIG. 3 there is shown a lithographically patterned array 310 and a heterojunction 312.

The lithographically patterned array 310 may comprise a pattern of alternating regions of the transitional metal dichalcogenides $MoSe_2$ and $MoS_2$ across a crystalline nanosheet, which may be fabricated in a process as described with respect to FIG. 1. The heterojunction 312 is a detail of the lithographically patterned array 310 at a boundary of adjacent $MoSe_2$ and $MoS_2$ regions.

The detail comprising the heterojunction 312 illustrates an edge view of the crystalline nanosheet and reveals a sharply defined heterojunction 312 boundary between the $MoSe_2$ and $MoS_2$ regions. To the left of the heterojunction 312 boundary, a middle layer of Molybdenum atoms (blue) is sandwiched between a top layer of $MoS_2$ atoms (green) and a bottom layer of $MoS_2$ atoms (green). To the right of the heterojunction 312 boundary, the middle layer of molybdenum atoms (blue) is sandwiched between a top layer of $MoSe_2$ atoms (red) and a bottom layer of $MoSe_2$ atoms (red). FIG. 3 also illustrates a conversion process from one composition of matter to a second composition of matter where MoS2 atoms (green) approach the left side of the heterojunction 312 boundary (shown arriving normal to the surface of the crystalline nanostructure), and $MoSe_2$ atoms (red) leave the crystal lattice of the nanostructure to be replaced by the $MoS_2$ atoms (green), as may occur during deposition of the $MoS_2$ atoms in the unmasked exposed regions 114 as described with respect to FIG. 1.

Referring again to FIG. 1, in some embodiments, electron beam lithography techniques may be utilized to design the desired patterns and apply a mask in the masked regions 112 onto the 2D crystalline nanosheet 108, for example, a $MoSe_2$ crystalline nanosheet. In this way, the mask may be precisely applied in the regions 112 in a specified pattern over the host $MoSe_2$ nanosheet 108 to form a desired pattern of lateral heterojunctions within the $MoSe_2$ crystalline nanosheet 108 lattice structure. For example, a dual beam focused ion beam may be utilized with pattern writing software to control the application of a precisely patterned mask 112. The pattern writing software, when executed by a computer processor may cause the processor to determine the desired 2-D pattern for the lateral heterojunctions and the regions of corresponding exposed 114 and masked 112 areas for the nanosheet. After pattern writing and developing the heterojunction pattern, a $SiO_2$ mask may be deposited onto the 2D crystalline nanosheet 108 using electron beam evaporation over the masked regions 112. In some embodiments, a mask of ~50 nm of $SiO_2$ may be electron beam evaporated to provide effective protection from sulfurization or conversion in the masked areas 112 of the 2D crystalline nanosheet 108 under the mask.

Once the process of converting the exposed areas to a different material is finished, for example, by converting the exposed areas of $MoSe_2$ populated lattice to $MoS_2$ populated lattice, the mask may be dissolved and removed from the crystalline nanosheet to expose non-converted regions 112 of the host $MoSe_2$ nanosheet 108 and an array or pattern of $MoSe_2$ to $MoS_2$ heterojunctions within the nanosheet 108. However, the disclosure is not limited to any specific method of applying and removing masks and any suitable method and mask materials may be utilized. For example, water soluble mask such as GeO, and KCl, etc. can be used for simplicity of a mask removal process.

The present disclosure provides improvements in methods, articles of manufacture, systems and new materials for 2D ultrathin integrated circuits with the controllable formation of semiconductor heterojunctions, by either of vertically stacking different layers or by formation of lateral heterojunctions of different semiconductors within a single nanostructure layer. Lithographic patterning together with compatible heterojunction synthesis approaches may be utilized for high density integration of semiconductor heterojunctions.

In some embodiments, the exposed regions 114 of a crystalline nanosheet 108 comprising a first composition of matter may be converted to a different composition of matter using pulsed laser deposition. For example, the exposed regions 114 may comprise $MoSe_2$ and may be converted to $MoS_2$ using high kinetic energy pulsed laser vaporization of sulfur atoms onto the exposed areas to form regions of $MoS_2$ atoms in the exposed regions 114, and to form $MoSe_2$ to $MoS_2$ lateral heterojunctions between the resulting $MoSe_2$ and $MoS_2$ regions. However, the disclosure is not limited to any specific method of converting material in the exposed regions 114 and any suitable method may be utilized. For example, plasma enhanced chemical vapor deposition (PECVD) or molecular beam epitaxy (MBE) methods may be used to produce and deliver atoms of interest for a conversion process.

Figure 4:
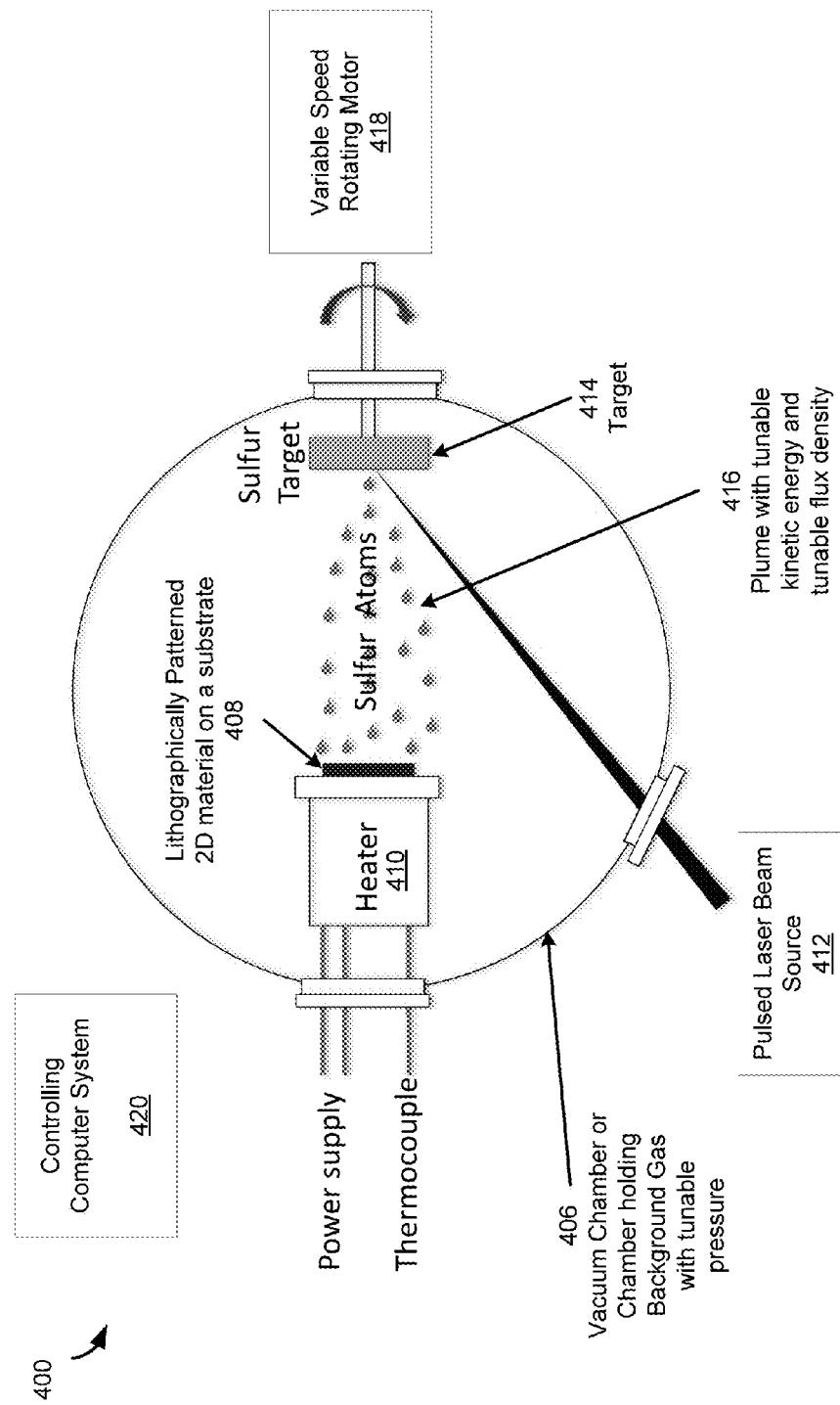
FIG. 4 is a schematic diagram of an exemplary system that may be utilized for delivering pulsed laser deposition of a controllable composition of matter within exposed regions of a lithographically masked two dimensional material to form lateral and/or vertical heterojunctions within the two dimensional material.

FIG. 4 is a schematic diagram of an exemplary system that may be utilized for delivering pulsed laser deposition of a controllable composition of matter within exposed regions of a lithographically masked two dimensional (2D) material to form lateral and/or vertical heterojunctions within the two dimensional material. Referring to FIG. 4 there is shown a pulse laser deposition (PLD) system 400 comprising a vacuum or gas chamber 406, a lithographically patterned 2D material 408, a heater 410, a laser beam generator 412; a laser target 414, a plume of matter 416, and a rotary motor 418. Also shown is a computer system 420.

In some embodiments, the lithographically patterned 2D material 408 may comprise a two dimensional material with a pattern of masked and exposed areas. The 2D material may comprise one or more crystalline layers, one or more organic or inorganic amorphous layers, or a mixture of crystalline and organic and/or inorganic amorphous layers. In some embodiments, the 2D material may comprise a monolayer nanostructure or a few-layer nanostructure, such as a bilayer or trilayer. In some embodiments, the lithographically patterned 2D material 408 may comprise a transitional metal dichalcogenide (TMD) monolayer or few-layer nanosheet that is lithographically masked, for example, with $SiO_2$. In some embodiments, the TMD may comprise $MoSe_2$ with semiconductor properties, for example. The lithographically patterned 2D material 408 may be coupled to a substrate material and/or mounted on a plate that may be heated by the heater 310. The substrate material may comprise, for example, Si or SiO2.

In some embodiments, the laser beam generator 412 may generate a pulsed laser that may be utilized to implement a physical vapor deposition (PVD) technique. The target 414 may comprise a material that is to be deposited on the lithographically patterned 2D material 408, for example, the target 414 may be made of sulfur. The target may be rotated by the motor 318.

The laser beam generator 412 may be operable to focus a pulsed laser beam inside the vacuum or gas chamber 406 to strike the target 414 to vaporize the rotating target to generate the plume of matter 416. The target 414 and plume of matter 416 may comprise any suitable material for deposition, for example, sulfur atoms may be ejected from the target 414 as well as other particles, for example, electrons, molecules or ions and may develop into plasma. The plume of matter 416 may propagate towards the heated lithographically patterned substrate 408. For example, the laser beam may strike the target at an acute angle and may propel the plume of matter 416 normal to the surface of the target towards the lithographically patterned substrate 408. Particles from the plume of matter 416, for example, sulfur atoms, may be deposited on the lithographically patterned substrate 408, where the particles from the plume of matter 416 may replace particles or atoms within the exposed regions of the lithographically patterned substrate to form one or more lateral heterojunctions within the lithographically patterned substrate 408, or may deposit another layer of atoms within the exposed regions. This process may occur in a vacuum or within the presence of a background gas, for example, oxygen within the chamber 406. In some embodiments, the presence of a background gas may attenuate the plume of matter 416 and/or may react with particles within the plume of matter 416 and may change the composition of the plume of matter and the type of material that is deposited on the patterned 2D material 408.

In some embodiments, atoms from the plume of matter 416 may replace atoms in a lattice structure located within the exposed regions of the lithographically patterned 2D material 408 and may convert the material of the exposed regions to a different material. For example, sulfur atoms from the plume of matter 416 may replace $MoSe_2$ atoms located within a nanoscale lattice structure of the exposed areas of the lithographically patterned 2D material 408 and may convert the $MoSe_2$ to $MoS_2$ within the exposed regions.

As a result of pulsed laser deposition of particles in the exposed regions, a plurality of lateral heterojunctions may be formed simultaneously within the lithographically patterned 2D material 408 with well-defined boundaries. The pattern of masked areas on the 2D material 408 may be removed, and the resulting plurality of precisely shaped and sharply defined lateral heterojunctions may be utilized in a circuit or device, for example, as a thin film semiconductor layer of a high-density, ultrathin and/or flexible device or material. In some embodiments, when a plurality of lithographically patterned areas of a $MoSe_2$ 2D material is converted to from $MoSe_2$ to $MoS_2$, the $MoS_2$ may be comparable in quality to a pristine $MoS_2$ material, with sharp (~5 nm) lateral heterojunction boundaries between the $MoSe_2$ and $MoS_2$. The $MoSe_2$ to $MoS_2$ lateral heterojunctions may exhibit n-n electrical conduction properties.

The conversion process and the quality or doping level of the resulting materials in the converted areas of the lithographically patterned 2D material 408 may be precisely controlled. For example, the PLD process provides for a digital or pulsed delivery of controlled amounts of deposited matter. The doping levels in the exposed areas may be controlled in a range of levels from 0% to 100% conversion. For example, exposed $MoSe_2$ regions may be partially doped or alloyed to a specified density, such as, replacing 20 percent of the selenium with sulfur. Alternatively, substantially all of the selenium atoms may be converted to, or replaced with sulfur atoms, in the exposed areas of the lithographically patterned substrate 408.

In some embodiments, high kinetic-energy impingement of replacement atoms in lithographically-patterned exposed regions or super-thermal kinetic energies may be applied during the conversion process utilizing pulse laser deposition (PLD). The nature of PLD allows for a very low average deposition rate per pulse which enables highly controllable flux to substrate deposition and fine tuning of the doping level or sulfurization in the exposed regions of the lithographically patterned substrate 408. However, the disclosure is not limited to utilizing PLD techniques and other methods may be utilized to convert the exposed material. For example, thermal evaporation or sputtering may be utilized. However, thermal evaporation and sputtering methods may not provide as high a level of kinetic energy as PLD. PLD may impart, for example, between 10 and 100 eV to the impinging atoms, whereas sputtering may provide 5-10 eV and thermal evaporation less than 1 eV. The high kinetic energy levels of the impinging atoms imparted by PLD may enhance properties of the converted material in the exposed regions of the lithographically patterned substrate 408. For example, the density of the converted films and their adherence in a substrate may be improved and mobility of species at the substrate surface may be improved.

Therefore, with a PLD process, the kinetic energy and/or flux density of the particles or atoms in the plume of matter 416 that reach and convert the exposed areas of the lithographically patterned 2D material 408 may be accurately controlled, thereby finely tuning the doping or conversion level and the quality of the resulting converted material, and the density and sharpness of the lithographically patterned lateral heterojunctions. These features of the resulting patterned arrays may be tuned to control electrical conduction performance of a semiconductor, insulator or conducting device that utilizes the patterned arrays, for example.

In some embodiments, the computer system 420 may automatically control operations of the laser generator 412 to perform the conversion process and automatically tune the levels and rate of doping in the exposed areas of the lithographically patterned 2D material 408. For example, the computer system 420 may automatically control pulsing of the laser by the laser beam generator 412 that may enable controlling of the rate of the conversion of the atoms in the lithographically patterned 2D material 408, where pulses of laser light striking the target 414 may generate controlled doses or sprinkles of atoms to the exposed areas (114) of the lithographically patterned 2D material 408. By automatically varying the energy level of laser pluses generated by the laser beam generator 412 that strike the target 414, the computer system 402 may control the kinetic energy of the of the particles or atoms in the plume of matter 416 that may be tuned to precisely control the doping level of a plurality of the exposed regions in the lithographically patterned 2D material 408. Furthermore, each pulse from the laser beam source 412 may be automatically controlled in pulse duration and/or frequency to control or tune the in the plume of matter 416 and finely tune the rate and level of conversion of the exposed regions, from one material to another material across the lithographically patterned 2D material 408. In one example, the duration of laser pulse may be on the order of a nanosecond and the resulting plume may take on the order of a microsecond to reach the lithographically patterned 2D material 408.

Utilizing lithographic patterning together with a controlled PLD technique, for example, to simultaneously convert multiple areas of one material to another material thereby forming multiple highly controlled heterojunctions in a 2D material or single nanostructure crystal, may avoid the problems associated with other methods of forming a heterojunction, such as vapor transport growth (VTG). For example, highly non-uniform spatial control over nucleation, growth and layer control problems owing to poor understanding, and a lack of control over gas flow dynamics, chemical reactions and boundary layer diffusion may be avoided by utilizing the presented lithographic patterning and PLD techniques. Moreover, challenges such as contamination by reaction byproducts, and reactivity at exposed crystal edges may be avoided.

Furthermore, a variety of methods and apparatus may be utilized to control or tune the conversion or doping level or rate of conversion from one material to another in the exposed regions of the lithographically patterned 2D material 408. For example, controlling sulfurization of a 2D $MoSe_2$ lithographically patterned material to form $MoS_2$. In order to tune the flux to substrate doping level or conversion rate, one or more factors such as the kinetic energy of the plume of matter 416 which may be adjusted by adjusting the energy level, pulse rate or pulse duration of the laser beam emitted from the laser beam generator 412; the level of heat applied to the lithographically patterned substrate 408 that may be adjusted by adjusting the heater 410; and the type of gas or the pressure level of a background gas that may be controlled by controlling a mechanical gas pressure pump within the vacuum or gas chamber 406. In some embodiments, tuning of the flux to substrate doping level or conversion rate in the exposed regions of the lithographically patterned 2D material 408 may be automatically controlled by the computer system 420, where instructions stored within the computer system 420, when executed by the computer system 420, may cause the computer system 420 to control one or more of the heater 410, the laser beam generator 412, a mechanical gas pressure pump within the vacuum or gas chamber 406 or the rotating motor 418 to fine tune the resulting composition of matter including the converted regions and the patterned lateral heterojunctions.

In some embodiments, for example in either partial or total conversion of $MoSe_2$ to $MoS_2$, Raman and photoluminescence (PL) spectroscopy and mapping may be utilized to confirm the formation of periodic heterojunctions. High-angle annular dark-field atomic resolution scanning transmission electron microscopy (STEM) may be utilized to reveal that converted MoS2 is comparable in quality to a pristine material, with sharp (~5 nm) heterojunction boundaries.

Moreover, many alternative options are available for converting selected areas of a monolayer or few layer 2D crystalline dichalcogenide into one or more other metal dichalcogenide forms, when lithographic patterning is utilized with PLD techniques. For example, metal atoms in an existing lattice nanostructure may be physically transformed or replaced without losing the lattice structure, while the stoichiometry and electrical conduction properties of the crystal may change significantly.

Figure 5:
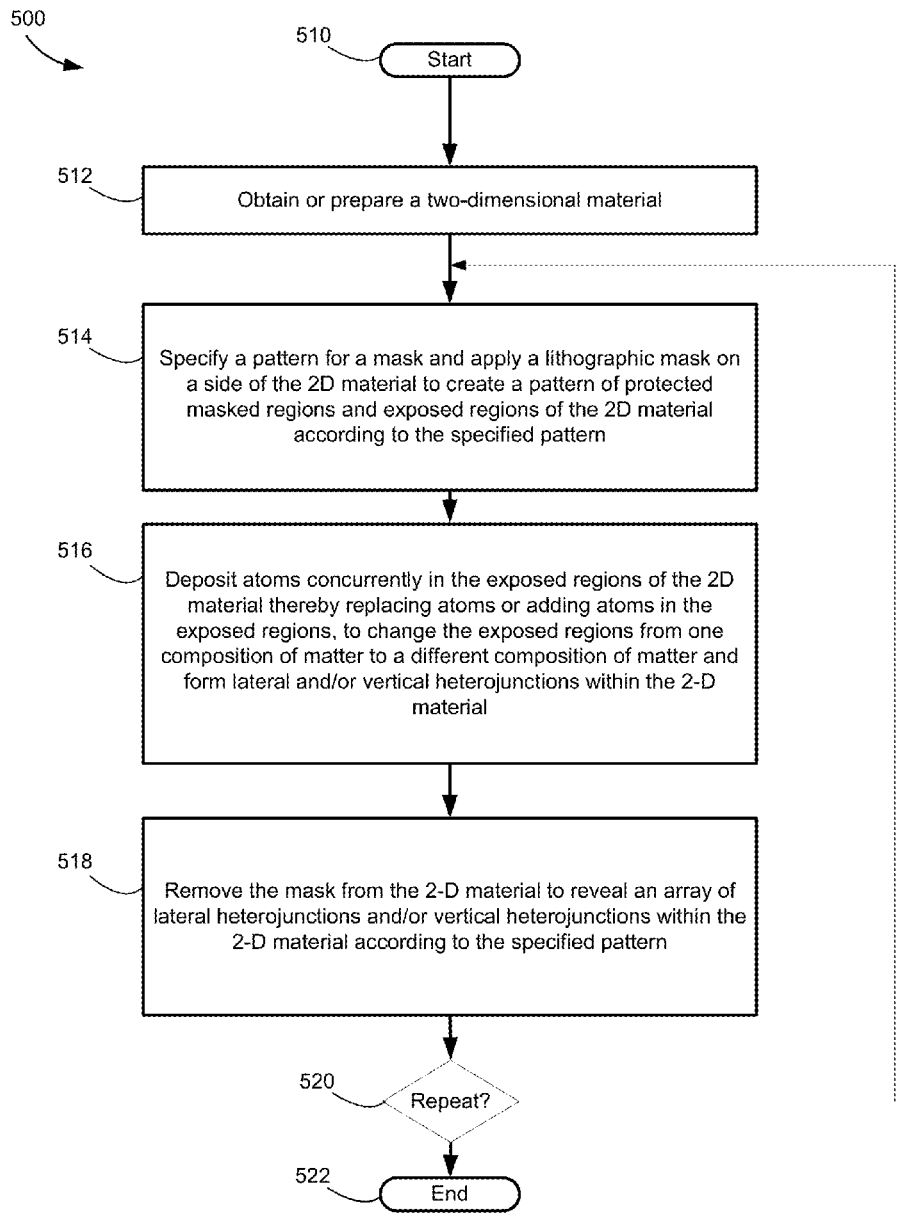
FIG. 5 is a flow chart representing exemplary steps for fabricating lateral and/or vertical heterojunctions in a two dimensional material.

FIG. 5 is a flow chart representing exemplary steps for fabricating lateral and/or vertical heterojunctions in a two dimensional material. The two dimensional material may comprise one or more crystalline layers, one or more organic or inorganic amorphous layers, or a mixture of crystalline and organic or inorganic amorphous layers. A two dimensional material may comprise a monolayer or few-layer nanostructure. The fabricated heterojunctions may comprise semiconductors, metals, insulators or a combination thereof.

Referring to FIG. 5, shown are exemplary steps 500. The exemplary steps begin with start step 510.

In step 512, a two-dimensional (2D) material is obtained or prepared.

In step 514, a pattern may be specified for a mask and a lithographic mask may be applied onto a planar side of the 2D material to create a pattern of protected masked regions and exposed regions of the 2D material according to the specified pattern.

In step 516, atoms may be deposited concurrently in the patterned exposed regions of the 2D material, thereby replacing atoms or adding atoms in the patterned exposed regions to change the exposed regions from one composition of matter to a different composition of matter and form lateral and/or vertical heterojunctions within the patterned exposed regions of the 2-D material.

In step 518, the mask may be removed from the 2-D material to reveal an array of lateral heterojunctions and/or vertical heterojunctions within the 2-D material according to the specified pattern. However, in some embodiments, the mask may be retained or removed before repeating one or more of the exemplary steps 500.

In step 520, in instances when one or more of the exemplary steps 500 are to be repeated, the exemplary steps may proceed to step 514. New 2D materials or new composition of matter comprising new lateral or vertical heterojunctions formed by the exemplary steps 514 to 518 or by repeating the exemplary steps 514 to 518 may be referred to as a new or subsequent generation of 2D material or composition of matter, for example, as a child 2D material or composition of matter converted from a parent 2D material or composition of matter.

In step 520, in instances when the one or more of the exemplary steps 500 will not be repeated, the exemplary steps may proceed to the end step 522.

In some embodiments of the exemplary steps 500, the lithographic patterning may be performed by electron beam lithography and in some embodiments the deposition of atoms may be performed utilizing pulsed laser deposition of the atoms. Furthermore, atoms impinging on the exposed regions of the 2D material during the deposition of atoms, may have high kinetic energy, for example, 10-100 eV. Moreover, the replacement of atoms may replace atoms in a single layer or multiple layers of the exposed regions, and metal or non-metal atoms may be replaced in a crystalline lattice structure or non-crystalline solid of the two dimensional material during the conversion process. The resulting two dimensional material may comprise p-n, n-n, p-p, n-p-n and p-n-p junctions or any suitable combination thereof, and may include materials such as semiconductors, metals, insulators or any suitable combination thereof.

Figure 6:
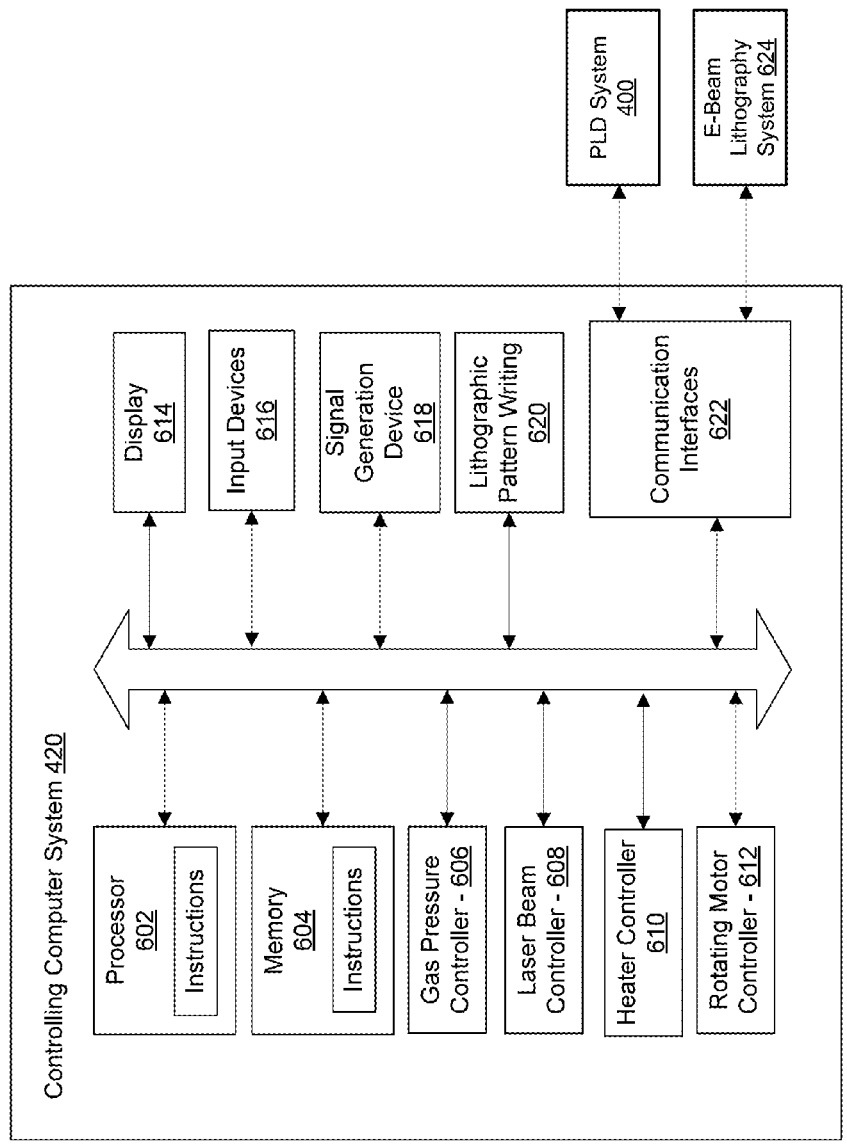
FIG. 6 is an exemplary system for automatically controlling concurrent fabrication of multiple lateral or vertical heterojunctions in a two dimensional material.

FIG. 6 is an exemplary system for automatically controlling concurrent fabrication of multiple lateral or vertical heterojunctions in a two dimensional material. Referring to FIG. 6, there is shown an exemplary computer system 420 that may comprise one or more processors 602, memory 604, a gas pressure controller 606, a laser beam controller 608, a heater controller 610, a rotating motor controller 612, a display 614, input devices 618, lithographic pattern writing controller 620 and communication interfaces 622. Also shown are the exemplary pulse laser deposition system 400 and an exemplary electron beam lithography system 624.

The exemplary computer system 420 may comprise any suitable circuitry, hardware processors, logic, interfaces and/or code that may be operable to store and execute instructions that cause the computer system 420 to control fabrication of heterostructure crystals in accordance with the present disclosure. For example, the computer system 420 may be communicatively coupled to the exemplary PLD system 400 described with respect to FIG. 4, and to the exemplary electron beam lithography system 624 to automatically control fabrication of 2D heterojunction materials in accordance with the present disclosure. The computer system 420 may be communicatively coupled to various additional instruments that may perform observations and measurements during the fabrication of the heterostructure crystals as described herein, for example, photoluminescence (PL) and Raman spectroscopy systems, atomic force microscopy (AFM) systems or scanning transmission electron microscopy (STEM) systems. The exemplary computer system 420 may be operable to receive user input and may collect, analyze and/or display data from the PLD system 400, the e-beam lithography system 624 any suitable additional instrumentation used to fabricate 2D heterojunction materials in accordance with the present disclosure.

The one or more processors 602 may comprise, for example, a central processing unit (CPU), a controller, microprocessor, digital signal processor, microcontroller, application specific integrated circuit (ASIC), discrete logic, a graphics processing unit (GPU), or a combination thereof or other types of circuits or logic. The one or more processors 602 may communicate via a bus system.

The memory 604 may communicate via a bus system. The memory 604 may be a main memory, a static memory, or a dynamic memory, for example. The memory 604 may include, but may not be limited to internal and/or external computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In some embodiments, the memory 604 may include a cache or random access memory for the one or more processors 602. Alternatively or in addition, the memory 604 may be separate from the processor 604, such as a cache memory of a processor, the system memory, or other memory. The memory 604 may comprise a transitory or a non-transitory computer readable storage medium. The memory 604 may comprise instructions that when executed by the one or more processors 602, cause the one or more processors to automatically control all a portion of 2D heterostructure material fabrication systems in accordance with the present disclosure, for example, to control the PLD system 400 and/or the E-beam lithography system 624 to fabricate 2D heterojunction materials in accordance with the present disclosure.

The gas pressure controller 606 may be communicatively coupled to the vacuum or background gas chamber 406 and may comprise any suitable circuitry, hardware processors, logic, interfaces and/or code that may be operable execute instructions that cause the gas pressure controller 606 to automatically control gas pressure or content of a background gas in the chamber for the fabrication of 2D heterojunction materials in accordance with the present disclosure.

The laser beam controller 608 may be communicatively coupled to the pulsed laser beam generator 412 and may comprise any suitable circuitry, hardware processors, logic, interfaces and/or code that may be operable to execute instructions that cause the laser beam controller 608 to automatically control or vary laser beam pulse signals, focus and energy level for a laser directed at a target for pulsed laser deposition of atoms or particles in the fabrication of 2D heterojunction materials in accordance with the present disclosure.

The heater controller 610 may be communicatively coupled to the heater 410 and may comprise any suitable circuitry, hardware processors, logic, interfaces and/or code that may be operable to execute instructions that cause the heater controller 610 to automatically control heat levels supplied to a nanostructure crystal mounted on or near the heater to control fabrication of 2D heterojunction materials in accordance with the present disclosure.

The rotating motor controller 612 may be communicatively coupled to the rotating motor 418 for controlling the rotation of the target 414, and may comprise any suitable circuitry, hardware processors, logic, interfaces and/or code that may be operable to execute instructions that cause the rotating motor controller 612 to automatically control rotation of the target in the fabrication of 2D heterojunction materials in accordance with the present disclosure.

The display 614, may be operable to display data from the PLD system 400, the e-beam lithography system 624 any suitable additional instruments used to fabricate, analyze or measure 2D heterojunction materials in accordance with the present disclosure.

The input device 618 may be operable to receive user or machine input for storage or usage by the computer system 420 used to fabricate 2D heterojunction materials in accordance with the present disclosure.

The lithographic pattern writing controller 620 may be utilized to specify patterns for defining the patterns of masked and an unmasked area and for applying the respective masks on the top and/or the bottom sides of the two dimensional materials, and thereby for designing the patterns of a plurality of heterojunctions fabricated within the two dimensional materials. The lithographic pattern writing controller 620 may be operable to automatically control writing and developing the lithographic mask patterns and applying the patterned lithographic masks to the two dimensional materials in accordance with the present disclosure.

The communication interfaces 622 may be communicatively coupled to the PLD system 400 and the e-beam lithography system 624 directly or via any suitable wireless, wired or optical network. In this regard, the exemplary computer system 420 may include one or more computing apparatuses to execute a series of commands representing the method steps described herein. The exemplary computer system 420 may include a cloud computing environment, which may allow the one or more computing apparatuses to communicate and share information through a wired or wireless network. The one or more computing apparatuses may comprise a mainframe, a super computer, a PC or Apple Mac personal computer, a hand-held device, a smart phone, or any other suitable apparatus having a central processing or controller unit known in the art. Each computing apparatus may be programmed with a series of instructions that, when executed, may cause the computer to perform the method steps as described and claimed in this application. The instructions that are performed may be stored on a machine-readable data storage device and may be carried out by the processing unit or controller to fabricate, measure, analyze and display the 2D heterojunction materials and fabrication processes in accordance with the present disclosure.

In operation, the exemplary computer system 420 may automatically control fabrication of 2D nanoscale materials comprising lateral and/or vertical heterojunctions in accordance with the present disclosure. For example, the computer system 420 may control the PLD system 400 the electron beam lithography system 624 in accordance with the descriptions of FIGS. 1-6 and throughout this disclosure, to automatically control concurrent fabrication of nanoscale 2D heterojunction materials comprising a plurality of lateral and/or vertical heterojunctions.

The production of new compositions of matter may be enabled by the conversion of one crystal to another in the unique deposition technique using digital or pulsed, high-kinetic energy deposition of atoms combined with lithographic patterning and the nature of single or few layer crystals. Moreover, the patterning and selective conversion process defined herein for semiconductor lateral heterojunctions provides a powerful technique that may be extended to form other metallic, insulating and semiconducting regions within 2D heterostructure materials that may be utilized in ultrathin or flexible electronics, for example.

The methods, compositions of matter, manufactures, systems, features and advantages described with respect to FIGS. 1-6 may be extended in a variety of ways, for example, as follows, to produce other 2D material heterojunctions, including lateral junctions and/or vertical junctions within a single 2D material such as a nanoscale heterostructure crystal.

In one example, replacement of metal atoms in addition to the chalcogen atoms may be conducted using the high kinetic energy plumes where, for example, a semiconductor may be converted from a molybdenum base type dichalcogenide (e.g. $MoS_2$, $MoSe_2$, $MoTe_2$) to, for example, a tungsten based type dichalcogenide (e.g. $WS_2$, $WSe_2$, $Wte_2$).

In one example, a unique composition of matter may be formed by the replacement of only the top layer of atoms in a nanosheet, for example, the top layer in a monolayer, by using discrete dosages and controlling the kinetic energy of the impinging atoms. For example, as a monolayer of $MoSe_2$ may be three atoms thick having a top layer of Se, a middle layer of Mo and a bottom layer of Se, only the top layer of Se atoms may be replaced to form a new type of layered material. In some embodiments, this process may be performed at low temperatures while controlling the kinetic energy of the impinging species.

In another exemplary extension of the above described methods, a unique composition of matter may fabricated, which may be obtained utilizing multiple steps or repetitions of a lithographic patterning and conversion process, for example, using a PLD conversion process. In one exemplary embodiment, stripes similar to those shown in FIG. 1, stage 104, may be lithographically masked onto a 2D material or nanosheet of a first material and the exposed areas may be converted to a different material, for example, from $MoSe_2$ to $MoS_2$. Subsequently, the mask may be removed and another mask may be lithographically applied in a "cross" stripe pattern to create a checkerboard type of pattern with the alternating stripes of different materials, for example MoSe2 and MoS2. The exposed areas of $MoSe_2$ and $MoS_2$ may be converted to areas of $WSe_2$ and $WS_2$ respectively, by replacing the metal Mo atoms with, for example, W atoms, as described above. The result would yield a checkerboard of four different semiconductors including $MoSe_2$, $MoS_2$, $WSe_2$ and $WS_2$. Many other patterns of metals, semiconductors and/or insulators may be fabricated by repeating the process of lithographic patterning followed by conversion of exposed areas to create lateral and vertical heterojunctions in a variety of patterns.

In some embodiments, a unique composition of matter, in which one metal chalcogenide crystal, for example, a semiconductor may be transformed into a material or materials having two or more different properties, for example, insulating and metallic properties. This process may be conducted by replacing either of the chalcogen or the metal atoms or both. It is noted that some metal chalcogens may be metallic, some may be insulating, and some may be semiconducting. Using the above described lithographic patterning and conversion process, different regions of a 2D material, for example, a crystalline nanosheet, may be converted in different processing steps to combine insulating, metallic, and semiconducting building blocks in one 2D composition of matter or nanosheet crystal, by converting areas in the original 2D material.

Furthermore, with respect to conversion to oxides and phase changes and the disclosed conversion strategy, it is noted that metal chalcogenides include oxides and that growth of $MoS_2$ typically involves the gas phase reaction of molybdenum oxide. Therefore, some chalcogenides such as $MoS_2$ and $MoSe_2$, etc. layered materials may be lithographically patterned and converted to oxides, such as $MoO_2$.

Furthermore, conversions within 2D materials, for example, bilayer and trilayer nanostructures, utilizing lithographic patterning with material deposition may form lateral and/or vertical heterojunctions. While conversion of a 3-atom-thick monolayer into another type of monolayer has been described herein, bilayers and trilayers of one or more materials may also be similarly converted into bilayers and trilayers including different materials. For example, in one embodiment, starting with a bilayer of $MoSe_2$, the selenium atoms of a top layer may be converted to sulfur by bombardment of the top side of the bilayer with sulfur atoms. Subsequently, using lithographic patterning, regions of both the top and bottom sides may be converted separately, into different semiconductors, metals, or insulators. In this way, one bilayer crystal may be converted to four different materials including vertical interconnects or heterojunctions between the layers if desired. Similarly for trilayers, by leaving the middle layer of three atoms untouched and converting the top and bottom layers, for example, a base semiconductor with vertical p-n-p or n-p-n junctions may be fabricated. Bilayer and tri-layer systems are comprised of two or three separated three-atom-thick, Se—Mo—Se, single layer with one placed on top of another.

In the described embodiments, atoms in an existing lattice may be transformed or replaced without losing the lattice structure, but the stoichiometry and properties of the converted crystal may be profoundly different from the original crystal. This tunable, versatile and scalable process for forming lithographically patterned lateral and/or vertical heterojunction arrays utilizing PLD techniques may enable the integration of the arrays as 2D layer 'building blocks,' with semiconductor, metal and/or insulator domains, for dense, ultrathin next-generation electronics. In some embodiments, millions of 2D building blocks may be made concurrently, and numerous patterns may be fabricated in each building block.

Exemplary Demonstrated Embodiments

The formation of patterned arrays of lateral heterojunctions between 2D layered semiconductors, $MoSe_2/MoS_2$, within the confines of a single monolayer $MoSe_2$ crystal. Heterojunction arrays are formed by sulfur replacement of Se within $MoSe_2$ (lattice constant 3.288 Å, optical bandgap 1.55 eV), converting it to $MoS_2$ (lattice constant 3.160 Å, optical bandgap 1.85 eV) in predefined locations. Utilizing photolithography and electron beam lithography processes, a variety of patterns exposed on monolayer MoSe2 crystals are selectively converted to $MoS_2$ by pulsed laser vaporization of sulfur, producing predefined arrays of lateral $MoSe_2/MoS_2$ heterojunctions within a single monolayer. This process provides a unique capability for the digital delivery of a precise amount of sulfur atoms with super-thermal kinetic energies during the conversion process, allowing controllable sulfurization for either alloying or total conversion of $MoSe_2$ to $MoS_2$. Raman and photoluminescence (PL) spectroscopy and mapping confirm the formation of periodic heterojunctions. High-angle annular dark field (HAADF) atomic resolution scanning transmission electron microscopy (AR-STEM) reveals that the MoS2 is comparable in quality to pristine material, with sharp (~5 nm) heterojunction boundaries. This controllable and versatile formation of lithographically-patterned lateral heterojunction arrays offers the potential for their integration as 2D layer "building blocks", along with metal/insulator domains, for next generation electronics.

Referring again to FIG. 1, including the schematically illustrated steps a-c, for the formation of periodic lateral heterojunctions including $MoSe_2/MoS_2$ heterojunction arrays. Image a, represents a starting $MoSe_2$ monolayer crystal. Image b, represents a $MoSe_2$ that is patterned by E-beam lithography and $SiO_2$ deposition, followed by sulfurization of uncovered areas. The $SiO_2$ mask is used to prevent the underlying $MoSe_2$ regions from reacting with sulfur while the exposed regions are converted to $MoS_2$. Image c, represents formation of arrays of lateral $MoSe_2/MoS_2$ heterojunctions within the monolayer crystal.

Referring to FIG. 2, the starting monolayer MoSe2 nanosheet crystals with lateral sizes ranging from 10-100 µm were synthesized were synthesized by PLD-assisted and conventional vapor phase transport (VTG) techniques. Conventional VTG involved vaporization of $MoO_3$ (99%, Sigma Aldrich) powder and selenium shots (99.99999%, Sigma Aldrich) in a tube furnace under argon (100 sccm) and hydrogen (10 sccm) flow and background pressure of 30 Torr at 800° C. for 30 min. PLD-assisted VTG, on the other hand, employed PLD to first deposit a uniform and precise amount of stoichiometric precursor nanoparticles onto a source substrate at room temperature that was then covered by a receiver substrate which was placed in contact and on top of the source substrate to form a confined VTG system. Both methods provided isolated and continuous monolayer $MoSe_2$ nanosheets. The as-synthesized $MoSe_2$ nanosheets were first identified by optical and atomic force microscopy (AFM) imaging and further studied under PL and Raman spectroscopy before patterning and conversion processes. As shown by optical and AFM images in FIG. 2, images a-d, both isolated and merged $MoSe_2$ monolayer crystals were obtained and identified. FIG. 2, images e and f show the corresponding Raman and PL spectra indicating the $E^1_{2g}$ Raman mode of $MoSe_2$ at 238 cm$^{-1}$ and a PL peak at 805 nm.

The crystals were then masked by conventional patterning processes followed by selective conversion of the unmasked MoSe2 to MoS2 by pulsed laser vaporization of sulfur. The masking material (~50 nm SiO2) was electron beam evaporated and was found to be quite effective in protecting the areas of the 2D crystal underneath from sulfurization.

Prior to the patterning process and formation of heterojunction arrays, the conversion of 2D monolayers was studied at various temperatures for different numbers of sulfur pulses to understand and optimize the process.

Prior to the patterning process and formation of heterojunction arrays, the conversion of 2D monolayers was studied at various temperatures and laser pulse numbers to understand and optimize the process. PL and Raman spectroscopies were utilized to investigate the extent of conversion and to reveal their optical properties.

Figure 7:
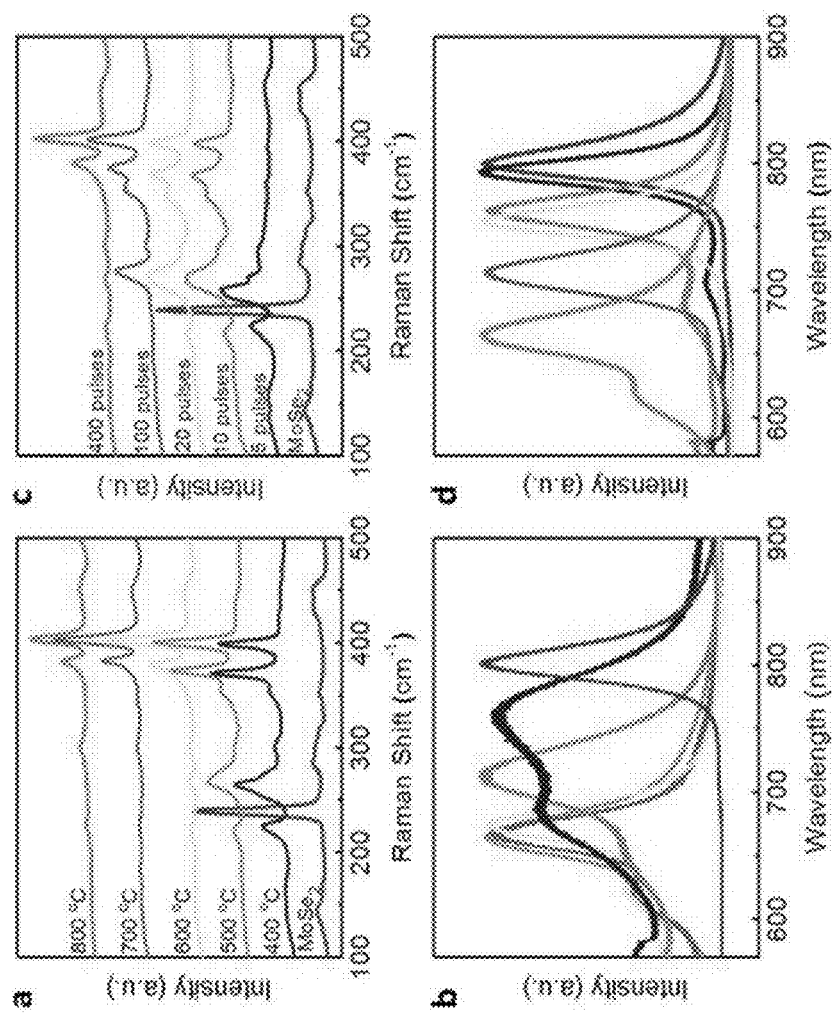
FIG. 7 is an image of data and/or images generated from an exemplary demonstration of two dimensional nanoscale heterostructure crystal processing and investigation.

To investigate the effect of substrate temperature on the conversion process, a large number of laser pulses (400) were delivered to provide sufficient sulfur for reaction at different substrate temperatures (400-800° C.). As shown by the Raman and PL spectra shown in FIG. 7, images a and b, MoSe$_2$ nanosheets were totally converted to MoS2 for temperatures above 600° C. Below 600° C., however, intermediate alloys where formed. At 400° C., for example, the E1 2 g mode of MoSe2 at 238 cm-1 disappeared while the A1 g and E1 2 g modes of MoS2 at 383 and 403 cm-1 were observed. However, as can be seen from the spectra, the Raman peak at 250 cm-1 changes significantly, possibly due to the crystal lattice distortion by partial alloying. This peak slowly weakened as the temperature increased and completely disappeared at 700 and 800° C. The corresponding PL spectra also show the optical bandgap evolution at these temperatures. The effect of various laser pulse numbers was also investigated at a fixed substrate temperature. FIG. 7 images c and d shows the Raman and PL evolution as a function of laser pulse number at a constant substrate temperature of 700° C. Here, different laser pulse numbers ranging from 5 to 400 provided precise amounts of sulfur that resulted in a tunable bandgap that ranged from MoSe2 at 800 nm to MoS2 at 660 nm.

PL and Raman spectroscopies were utilized to investigate the crystal conversion process at various conditions and to reveal their optical properties.

Referring again to FIG. 7, Raman and photoluminescence characterization of various conversion conditions. In images a and b, Raman and corresponding PL spectra of a monolayer crystal under different conversion temperatures while keeping the other experimental conditions constant (i.e. 400 sulfur pulses, target to substrate distance of 11 cm, and laser fluence of 0.5 J/cm$^2$). At 400-500° C., the original Raman peak of the MoSe$_2$ nanosheet at 238 cm$^{-1}$ disappears and MoS$_2$ peaks at 387 and 403 cm$^{-1}$ show up. Also, the corresponding PL peak at 805 nm shifts to lower wavelengths. Disorder peaks at ~220 and 260 cm$^{-1}$ indicate incomplete conversion and formation of intermediate alloys. Complete conversion is observed for temperature above 600° C. In FIG. 7, images c and d, Raman and PL spectra showing conversion evolution as a function of sulfur pulse number at a constant temperature (700° C.) and the same distance (11 cm) and laser fluence (0.5 J/cm2). The Raman and PL peaks of MoSe2 slowly shift toward those associated with MoS2 as the number of sulfur pulses increase, thereby resulting in a tunable bandgap.

MoSe$_2$ nanosheets were totally converted to MoS$_2$ for substrate temperatures above 600° C. and 300 laser-vaporized sulfur pulses whereas temperatures and laser pulses below 600° C. and 300 pulses, respectively, resulted in the formation of intermediate compositions. At temperatures above 800° C., decomposition and damage of the crystals occurred. Therefore, substrate temperatures were fixed at 700° C. with 400 sulfur pulses to ensure a complete conversion of MoSe$_2$ to MoS$_2$. Conversion of WSe$_2$ to WS$_2$ was also achieved by the same process to demonstrate the broad applicability and advantages of the technique.

Figure 8:
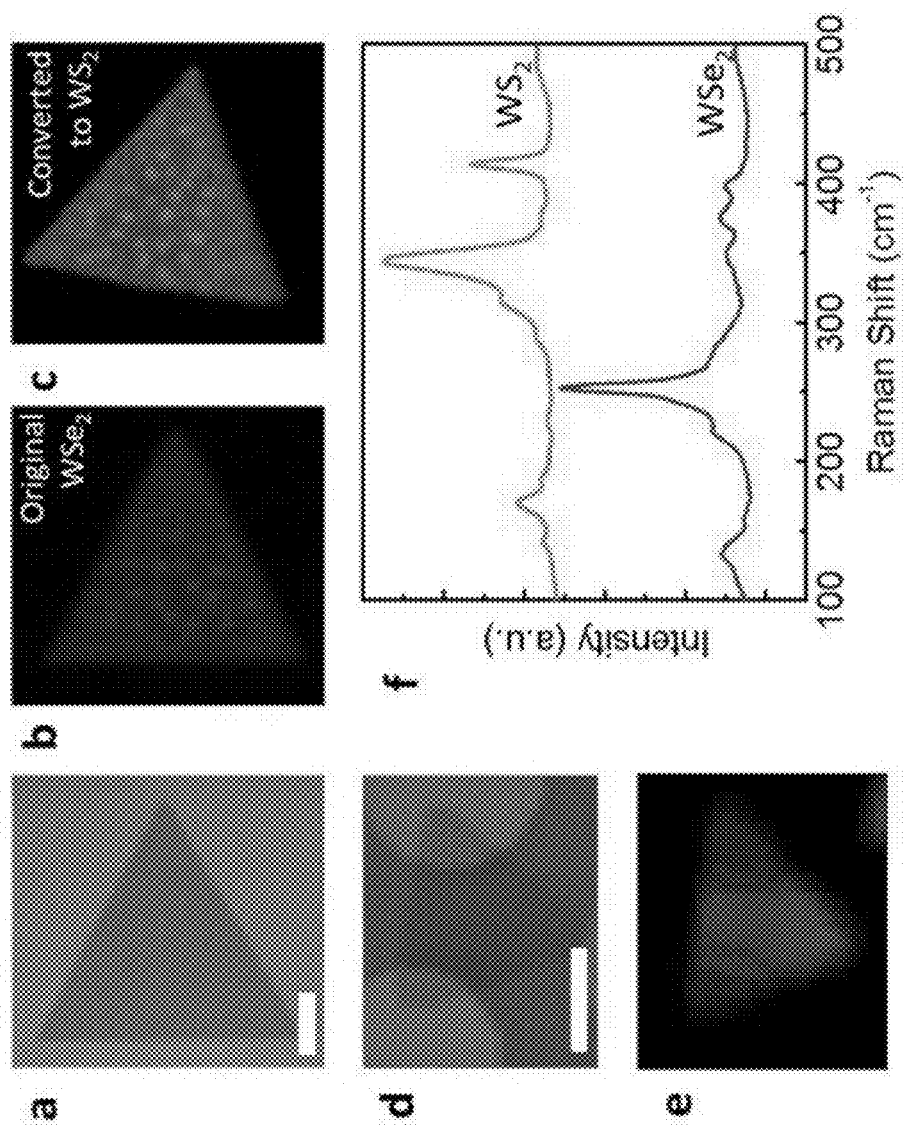
FIG. 8 is an image of data and/or images generated from an exemplary demonstration of two dimensional nanoscale heterostructure crystal processing and investigation.

Referring to FIG. 8, shown are images and data from a conversion of WSe$_2$ to WS$_2$ and formation of lateral heterojunctions. In images a-c, optical image and Raman maps of a monolayer nanosheet before and after the complete conversion process (300 pulses at 700° C.), respectively, indicating uniform intensity across the entire crystal. In FIG. 8, images d and e, heterojunctions formed within monolayer crystals by patterning and selective conversion processes. The green and red Raman maps are obtained from corresponding optical images representing the WS$_2$ (intensity map at 350 cm$^{-1}$), WSe$_2$ (intensity map at 248 cm$^{-1}$) regions. In image f, representative Raman spectra of the pristine WSe$_2$ and converted WS$_2$ regions. All of the scale bars are 5 μm in length.

Regarding the conversion and formation of WSe$_2$/WS$_2$ heterojunctions, to show the broad and compelling technological advantages the conversion of WSe$_2$ to WS$_2$ similar to MoSe$_2$/MoS$_2$ process has also been demonstrated. WSe$_2$ nanosheets are totally converted to WS$_2$ for substrate temperatures of 700° C. and 300 laser-vaporized sulfur pulses. FIG. 8, images a-c shows the optical image and Raman maps of a WSe$_2$ monolayer before and after the conversion process. The WSe$_2$ and WS$_2$ Raman maps are plotted for the $E^1_{2g}$ mode of WSe$_2$ at 248 cm$^{-1}$ and $E^1_{2g}$ modes of WS$_2$ at 350 cm$^{-1}$, respectively. FIG. 8, images d-e shows the optical image and Raman map of a patterned converted flake indicating the formation of heterojunction between the WSe$_2$ and WS$_2$ crystals. Representative Raman spectra of the flake before and after the conversion process are shown in Supplementary FIG. 8, image f indicates WSe$_2$ and WS$_2$ Raman peaks.

The thermodynamic stability and optical band gaps of various 2D transition metal dichalcogenide alloys ($M_{2(1-x)}$, $X'_{2x}$). Of these, MoS2 yet all MX where M=Mo, W and X, X'=S, Se, Te) have previously been computationally predicted to understand the mixing and phase segregation behavior for different alloy compositions. Of these MoS$_{2x}$Se$_{2(1-x)}$ alloys were found to have the lowest free energy of mixing, yet all MX26$_{2(1-x)}$X'$_{2x}$ were predicted to form stable alloys with complete miscibility at the moderate temperatures typically employed during CVD or bulk synthesis, and with continuously tunable direct band gaps, making them good candidates for two-dimensional optoelectronics.

Figure 9:
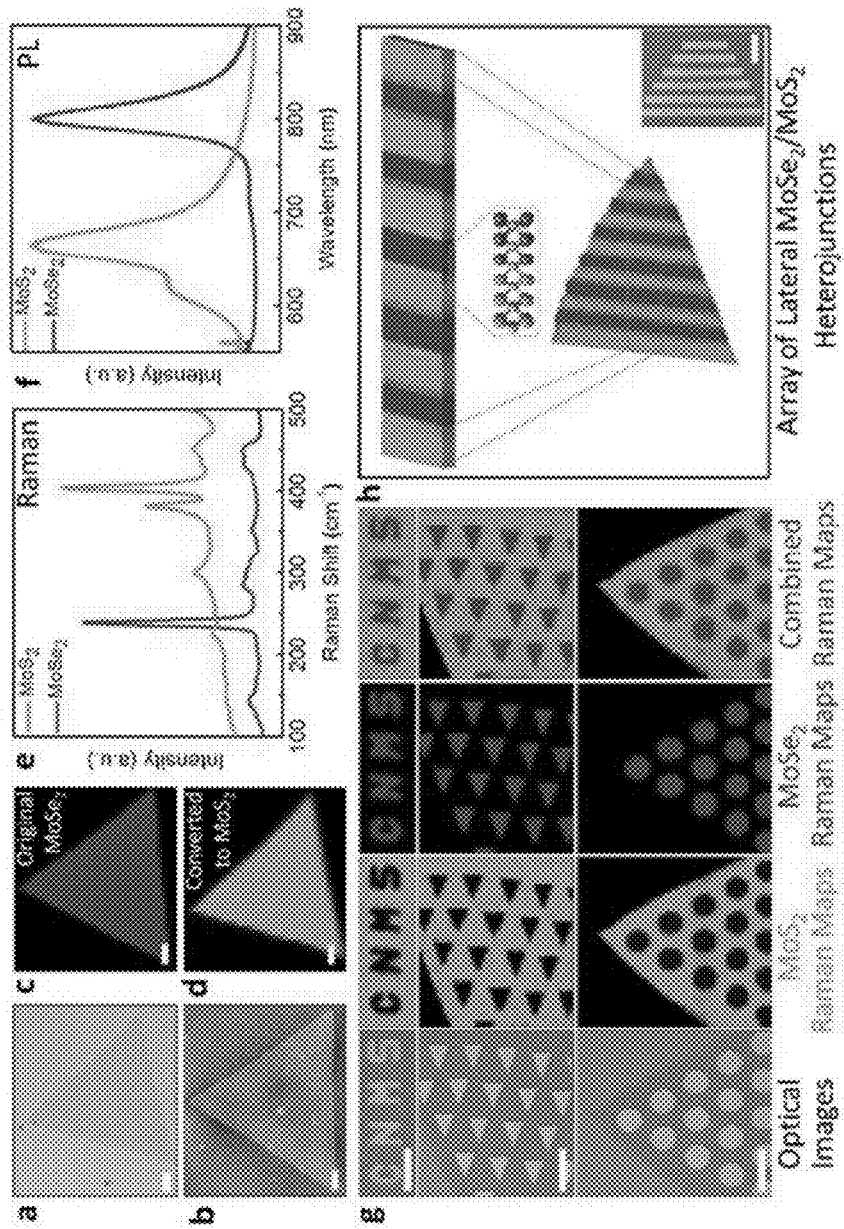
FIG. 9 is an image of data and/or images generated from an exemplary demonstration of two dimensional nanoscale heterostructure crystal processing and investigation.

Referring to FIG. 9, there is shown a conversion of MoSe$_2$ to MoS$_2$ and formation of lateral heterojunction arrays. In images a and b, optical and AFM images of a typical MoSe$_2$ monolayer with lateral size of ~40 μm. In images c and d Raman maps of a monolayer nanosheet before and after the complete conversion process (400 pulses at 700° C.), respectively, indicating uniform intensity across the entire crystal. In images e, f, representative Raman and PL spectra of the pristine MoSe$_2$ and converted MoS$_2$ regions. In images g, h, various examples of lateral heterojunction arrays formed within monolayer crystals by patterning and selective conversion processes. The green, red and combined Raman maps are obtained from corresponding optical images representing the MoS$_2$ (intensity map at 403 cm-1), MoSe$_2$ (intensity map at 238 cm-1) and overlaid MoSe$_2$/MoS$_2$ regions. All of the scale bars are 5 μm in length.

Raman and PL spectroscopy were utilized to probe the structures spatially, monitor the conversion degree, and to map the heterojunction arrays within the monolayer crystals. FIG. 9, images a, b show optical and AFM images of a typical MoSe2 2D crystal. The corresponding Raman maps of the crystal before and after the full conversion process are shown in FIG. 9, images c, d. The MoSe2 and MoS2 Raman maps are plotted for the E12 g mode of MoSe2 at 238 cm-1 and E12 g modes of MoS2 at 403 cm-1, respectively. Representative Raman and PL spectra of the flake before and after the conversion process are shown in FIG. 9, images e, f indicate MoSe2 and MoS2 Raman peaks. The uniform intensity distribution in the Raman maps indicates spatial uniformity of the 2D crystals both before and after the conversion. FIG. 9, images g, h shows the formation of various lateral heterojunction arrays prepared by our patterning and selective conversion process. Similarly, the uniform intensity of Raman maps clearly indicates the spatial uniformity of the MoSe2 and MoS2 domains and formation of heterojunction arrays within the monolayer crystals. The Raman and PL spectra obtained from the pristine and converted regions of the crystals are similar to the ones shown in FIG. 9, images e, f.

Figure 10:
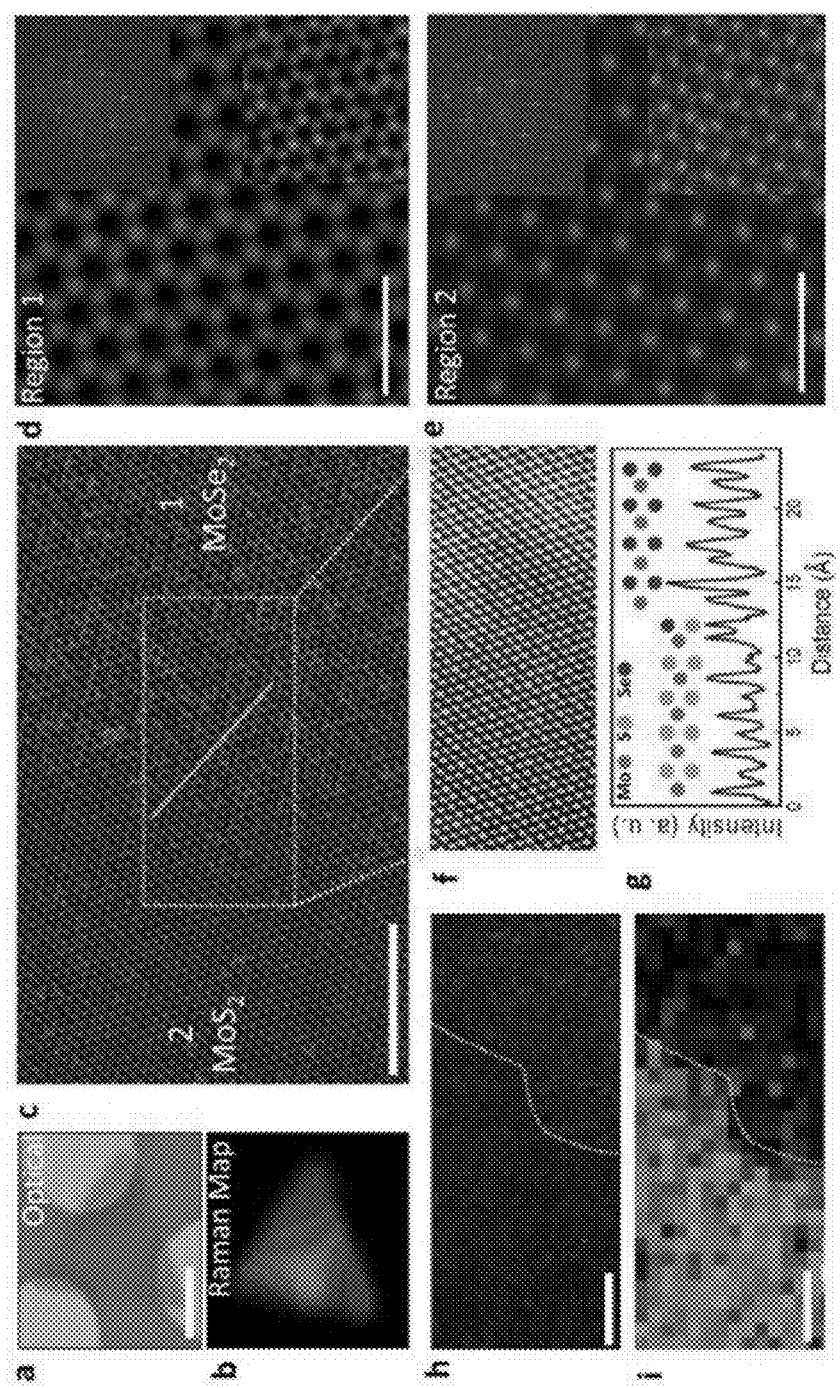
FIG. 10 is an image of data and/or images generated from an exemplary demonstration of two dimensional nanoscale heterostructure crystal processing and investigation.

Referring to FIG. 10, STEM Z-contrast image and elemental imaging of heterojunction. In FIG. 10, images a, b, Optical image and corresponding Raman map of a patterned nanosheet on a SiO2 substrate (scale bar is 5 µm). The SiO2 masks (circular discs in image 10 a) are removed during KOH etching and transfer of the nano sheet onto the TEM grids. In FIG. 10, image c, low magnification z-contrast image of the nanosheet showing the MoSe2 and MoS2 regions with a finite boundary across the domains (scale bars 5 nm). In FIG. 10, images d, e, Fourier filtered images of the atomic resolution Z-contrast images of the MoSe2 and MoS2 (bottom insets in the images) domains with corresponding FFT pattern (top insets in the images). In FIG. 10, images f, g, surface and line intensity profiles of the squared and line marked regions FIG. 10, image c. In FIG. 10, images h, i, low magnification image of a boundary with its corresponding EELS map showing the sulfur concentration (scale bars 5 nm).

STEM Characterization of Heterojunctions

Crystalline structures of the converted and pristine regions as well as their heterojunction boundaries are also studied by atomic resolution Z-contrast STEM. Referring to FIG. 10, images a, b shows the optical image and corresponding Raman map of a typical patterned/converted layer transferred onto a grid for STEM imaging.

Figure 11:
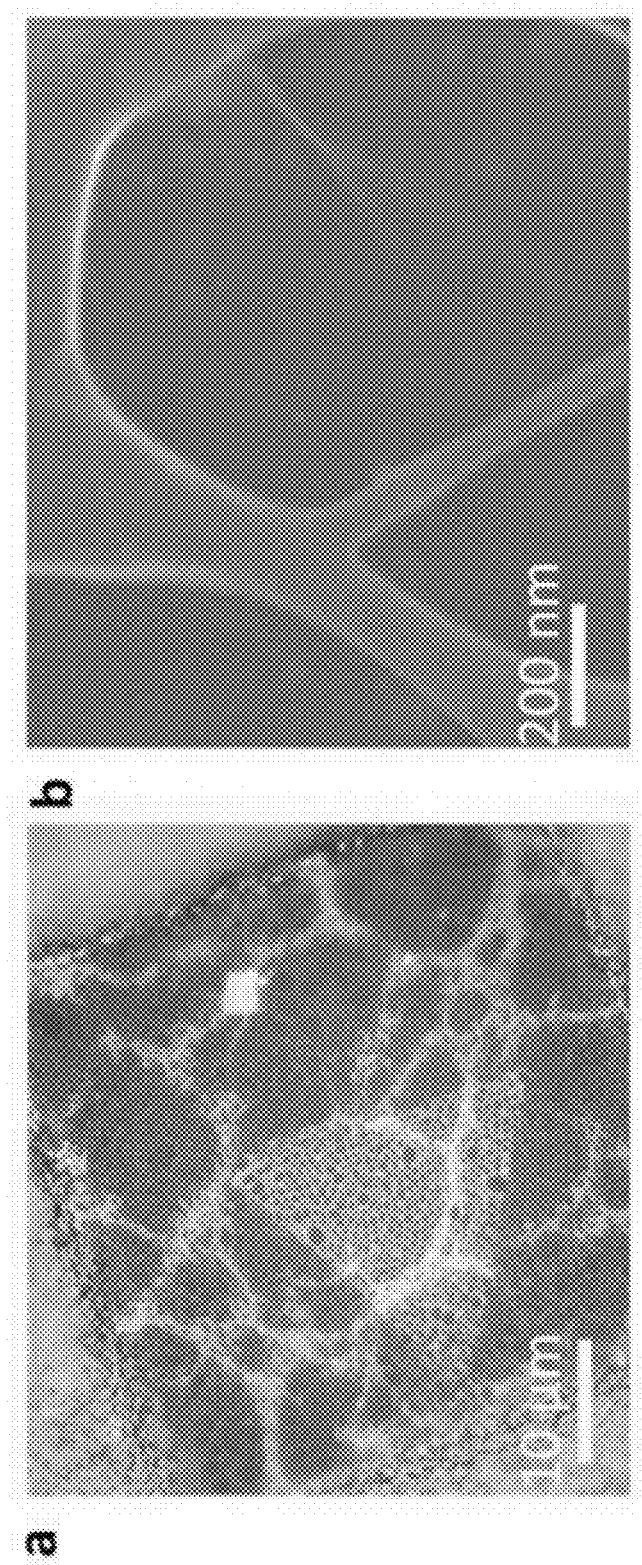
FIG. 11 is an image of data and/or images generated from an exemplary demonstration of two dimensional nanoscale heterostructure crystal processing and investigation.

Referring to FIG. 11, TEM a sample transfer. In FIG. 10, image a, optical image of a converted triangular crystal transferred onto a lacey carbon TEM grid. FIG. 10, image b, zoomed-in SEM image of the crystal suspended over the lacey carbon hole.

Regarding sample transfer to TEM grids, the transfer of nanosheets onto TEM grids was performed by mechanical transfer using a PMMA-assisted method (PMMA=poly (methyl methacrylate) provided by Micro Chem, product number 950 PMMA A4). After spin-coating the sample with PMMA, the $SiO_2$ layer between the monolayer flakes and the Si substrate was etched by a 2M KOH solution, thereby promoting lifted-off of the PMMA/flakes ensemble, which was then transferred onto TEM grids and allowed to air dry. The PMMA was then removed by soaking in acetone followed by a final rinse in isopropanol. Supplementary FIG. 11, images a, b show the optical and SEM images of a monolayer crystal transferred to a TEM grid.

As shown in FIG. 10 image c, atomic resolution Z-contrast STEM images are taken at the heterojunction that clearly shows both MoSe19 The boundary appears to be a $MoS_2$ (FIG. 10 image d) and $MoS_2$ (FIG. 10 image e) 2D crystal domains. The line and surface intensity profiles of the selected regions in FIG. 10, image c are shown in FIG. 10, images f, g. Likewise, FIG. 10, images h, i show a STEM image of a boundary with its corresponding electron energy loss spectroscopy (EELS) map showing the sulfur content (in green) as a function of position. It is clear that both pristine $MoSe_2$ and converted $MoS_2$ regions lie within the same honeycomb lattice with no grain boundaries—i.e., the $MoSe_2$ crystal serves as a template, maintaining the same crystal orientations throughout the whole structure. As can be seen from the STEM image, the interface has a finite width similar to that reported for $MoSe_2/WSe_2$ heterojunctions.$_x Se_{1-x}$ ternary alloy with a composition gradient over a distance of several nanometers. The sharpness of the heterojunctions is related to the e-beam lithography and patterning processes used in this work that can be improved further.

Electrical Transport Properties

Figure 12:
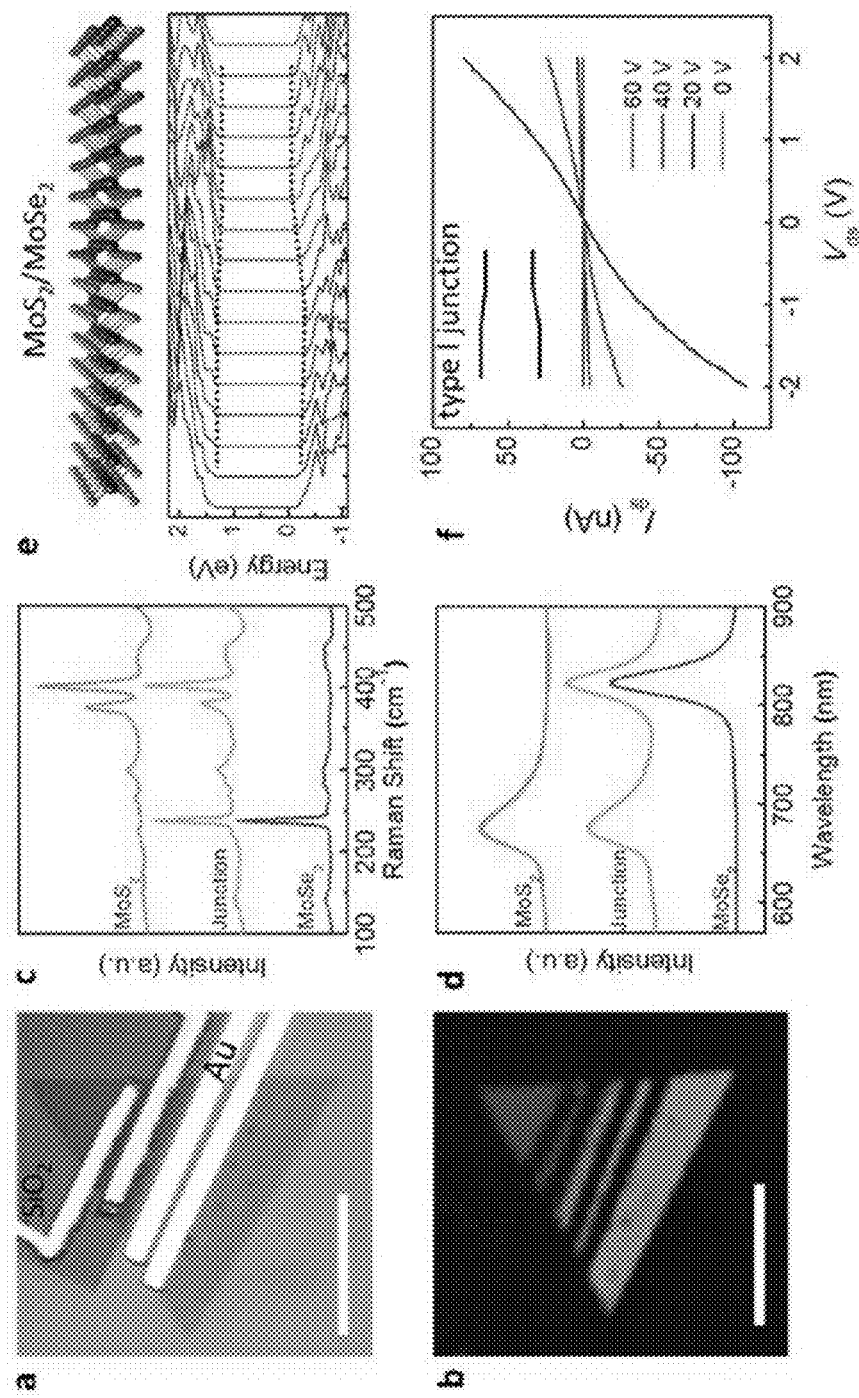
FIG. 12 is an image of data and/or images generated from an exemplary demonstration of two dimensional nanoscale heterostructure crystal processing and investigation.

The electrical transport properties of pristine MoSe2, converted MoS2, and their heterojunctions were studied by forming a device structure. FIG. 12, image a shows an example of a device structure fabricated in this work. Prior to the conversion process, two electrodes were fabricated on one side of the crystal to measure the transport properties of the pristine MoSe2. Then, this part was covered with a SiO2 mask and the sulfurization was carried out resulting in the conversion of the exposed half of the crystal to MoS2. Two electrodes were then fabricated on this half to measure the electrical transport characteristics of the converted MoS2 region. FIG. 12, image b shows the Raman map of the device with red and green colors clearly indicating the MoSe2 and MoS2 regions and their boundaries. Representative Raman and PL spectra of these regions are also shown in FIG. 12, images c, d, indicate distinct Raman and PL peaks for each domain while observing simultaneous MoSe2 and MoS2 peaks right at the junction.

Referring again to FIG. 12, electrical transport properties. In FIG. 12, images a, b, optical and Raman map of a MoS2/MoSe2 (green/red) heterojunction device. In FIG. 12, images c, d, Raman and PL spectra of MoS2 and MoSe2 obtained from each regions showing distinct peak for regions away from the junction and appearance of both peaks at the junction. In FIG. 12, image e, first principle DFT calculation of MoSe2 and MoS2 super lattices showing the formation of type-I band alignment. In FIG. 12, images f, Ids-Vds characteristics of the heterojunction showing an n-n junction behavior at the interface.

To understand band alignment at the interface, first-principles calculations, based on density functional theory, were performed using the Vienna ab initio Simulation Package.

Regarding first-principles calculations, based on density functional theory, were performed using the Vienna Ab initio Simulation Package. The projector augmented wave method was used to mimic the ionic cores, while the LDA considering the Ceperly-Alder-Perdew and Zunger (CA-PZ) functional was employed for the XC functional. Atomic positions, as well as lattice parameters, were optimized using a conjugate gradient algorithm. The ionic and electronic relaxations were performed by applying a convergence criterion of $1\times10-2$ eV/Å per ion and 10-5 eV per electronic step, respectively. The rectangular MoS2-MoSe2 hybrid structure, 44.1×3.2 Å, was used for the LDOS calculations, and a vacuum of 20 Å between the hybrids was considered. Also, 1×10×1 Monkhorst-Pack meshes were used to perform the integration over the Brillouin zone.

As illustrated in FIG. 12, image e, we considered a supercell in which 8 zigzag rows of $MoS_2$ joined 8 rows of $MoSe_2$ and plotted the partial density of states (DOS) projected onto the atomic rows in the $MoS_2$ and $MoSe_2$ across the heterojunction. From the projected DOS, we can see that there exists an obvious graded bandgap across the heterojunction. In particular, we find that the lateral $MoS_2/MoSe_2$ heterojunction forms a type-I band alignment as indicated by the dotted line (FIG. 12, image e) since the bandgap of $MoS_2$ entirely overlaps that of $MoSe_2$.

Figure 13:
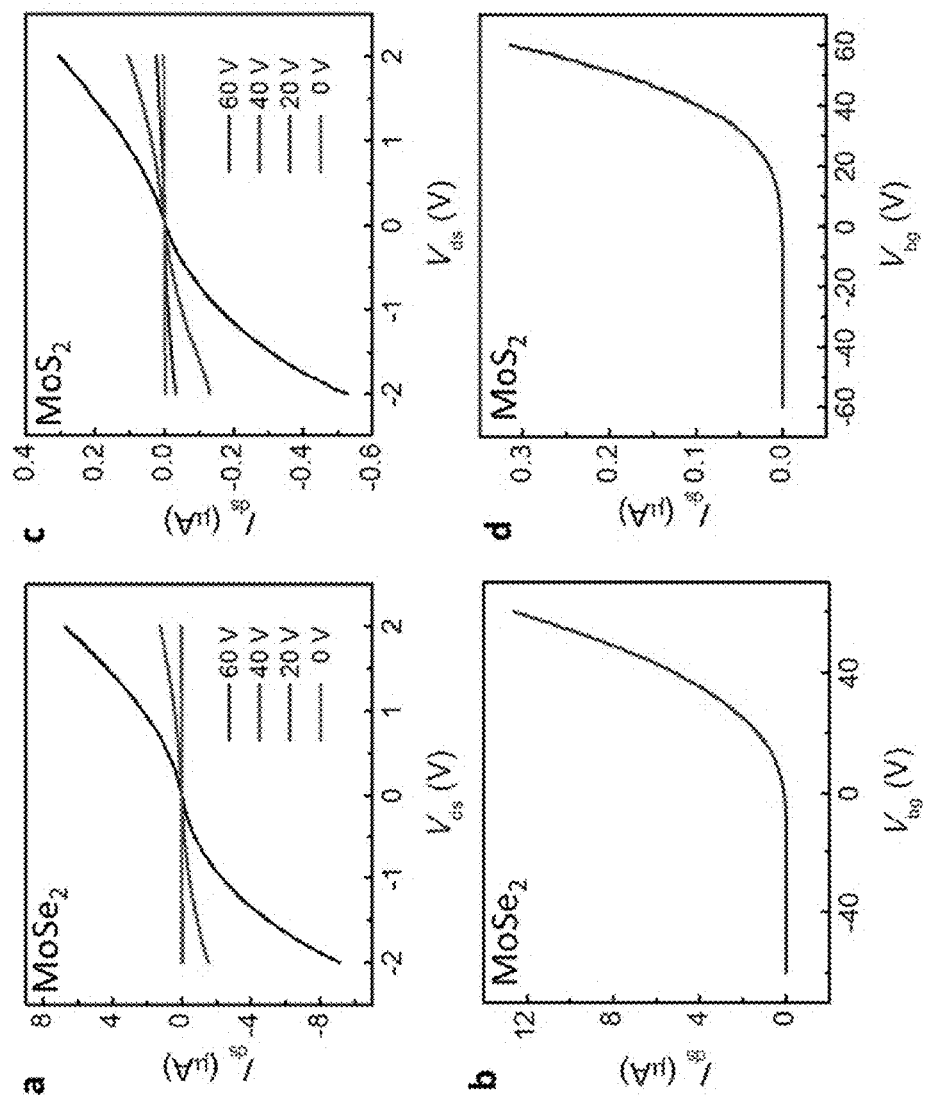
FIG. 13 is an image of data and/or images generated from an exemplary demonstration of two dimensional nanoscale heterostructure crystal processing and investigation.

Ids-Vds curves were obtained from pristine MoSe2, converted MoS2, and their heterojunction to investigate their transport characteristics. According to the measured Ids-Vds curves, both MoSe2 and converted MoS2 show n-type behavior Referring to FIG. 13, electrical transport characteristics were obtained from both pristine MoSe2 and converted MoS2 regions of the crystals. In FIG. 13, images a, b, Ids-Vds and Ids-Vbg of MoSe2 region showing symmetrical curves with n-type transport characteristics. In images c, d, Ids-Vds and Ids-Vbg of MoS2 region showing symmetrical curves with n-type transport characteristics.

Consequently, as shown in FIG. 12, image f, their boundary shows transport characteristic of an n-n heterojunction. The smaller current amplitude across the heterojunction boundary could be attributed to electron scattering at the heterojunction and the type of their band alignment.

Discussion

In conclusion, through lithographic patterning and controllable conversion of $MoSe_2$ to $MoS_2$, arrays of lateral $MoSe_2/MoS_2$ heterojunctions have been synthesized within a monolayer 2D crystal. Electron—beam lithography coupled with vacuum deposition of $SiO_2$ masks and sulfur, two scalable techniques used in the semiconductor industry, were employed to form sharp (~5 nm) heterojunctions comparable to those formed by heteroepitaxy, without the non-uniformities typically introduced in VTG processes. Pulsed laser vaporization provided a controllable and rapid method to explore the conversion dynamics through the digital delivery of precise quantities of sulfur precursor. The patterning and selective conversion process demonstrated here for semiconductor heterojunctions appears to be a powerful technique that could be extended to form other metallic, insulating, and semiconducting regions within 2D materials required for ultrathin electronics.

Methods

Regarding E-beam Patterning Process, electron beam lithography (FEI DB-FIB with Raith pattern writing software) was used for $MoSe_2/MoS_2$ heterostructure device fabrication. Firstly, a layer of PMMA 495A4 was spin-coated on top of the $MoSe_2$ flakes, followed by a 180° C. bake on a hot plate. After pattern writing and developing, 50 nm of $SiO_2$ was deposited using electron beam evaporation to serve as conversion masks. For device fabrication, 5 nm of Ti and 30 nm of Au were deposited using electron beam evaporation to serve as electrodes on the $MoSe_2$ flakes. After the $MoSe_2$ was converted to $MoS_2$, electron beam lithography was conducted again to place electrodes on the $MoS_2$. Finally, lift-off using Acetone/IPA was used to reveal well-defined electrodes on both the $MoSe_2$ and converted $MoS_2$ flakes.

Regarding the conversion process, the conversion was performed in a vacuum (~10-5 Torr) chamber where the forward directed laser-vaporized sulfur plume is generated and digitally delivered to the surface of the crystals. 28 The vaporization target was prepared by compressing sulfur powder (99%, Sigma Aldrich) into a pellet and the laser fluence is adjusted to about 0.5 J cm-2 (spot size of 2×5 mm and repetition rate of 0.5 Hz) to ensure the transfer of a fixed amount of sulfur onto the crystals for all of the experimental conditions. The conversion was conducted under various substrate temperatures and laser pulses to understand and optimize the process (as described above with respect to FIG. 7.

Regarding optical characterizations, Raman and PL mapping and spectra were performed in a Renishaw inVia micro-Raman system using a 532 nm laser excitation source, 1800 g/mm2 grating, and a laser power of about 1-5 mW through 50 and 100× objective lenses at room temperature. Maps were obtained with MoSe.

Regarding STEM Z-contrast imaging and analysis, all STEM samples were baked at 160° C. for 8 hours under vacuum before the microscopy experiment. Scanning transmission electron microscopy (STEM) imaging was performed on an aberration-corrected Nion UltraSTEM-100 operating at 60 kV. The convergence semi-angle for the incident probe was 31 mrad. Z-contrast images were gathered for a half-angle range of ~86-200 mrad. Electron energy loss spectroscopy (EELS) and spectrum imaging was performed using a Gatan Enfina with a nominal collection angle of 35 mrad.

Regarding electrical transport characterization, the electrical measurement of $MoSe_2/MoS_2$FET devices was conducted in a vacuum chamber (~106 torr) using a Keithley 4200 semiconductor analyzer. The drain/source voltage ($V_{ds}$) was set at 2V with gate voltage that swept from -60 to +60V for transport measurement. 2/MoS2 sections and their overlaid images.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for making lateral or vertical heterojunctions in a two dimensional material, the method comprising:
   depositing a lithographic mask on a two dimensional material forming a pattern of masked regions and exposed regions of the two dimensional material;
   depositing atoms concurrently in the exposed regions of the two dimensional material forming lateral or vertical heterojunctions in the two dimensional material according to the deposited lithographic mask;
   specifying a pattern of masked and exposed regions for constructing lateral or vertical heterojunctions within a two dimensional material comprising a first composition of matter;
   applying an electron beam lithographic mask onto a planar surface of the two dimensional material in selected areas of the planar surface according to the specified pattern of masked and exposed regions; and
   converting exposed regions of the two dimensional material to a second composition of matter to form the lateral or vertical heterojunctions comprising the first composition of matter and the second composition of matter within a converted two dimensional material according to the specified pattern.

2. The method of claim 1, wherein the two dimensional material comprising the first composition of matter includes:
   a substrate coupled to an original two dimensional material by van der Waals forces; or
   a substrate coupled to an original two-dimensional material by van der Waals forces and an overlayer coupled to the original two dimensional material.

3. The method of claim 1, wherein the two dimensional material or the converted dimensional material comprises a two dimensional monolayer, a two dimensional bilayer or a two dimensional trilayer crystalline material.

4. The method of claim 1, wherein the two dimensional material or the converted two dimensional material comprises a two dimensional crystalline material, a two dimensional amorphous organic or inorganic material, or a mixture of two dimensional crystalline and amorphous organic or inorganic materials.

5. The method of claim 1, wherein a plurality of the lateral or vertical heterojunctions comprising the first composition of matter and the second composition of matter within the converted two dimensional material are formed concurrently according to the specified pattern.

6. The method of claim 1, further comprising:
replacing atoms within a lattice structure of the first composition of matter with atoms of a species of atoms alien to the first composition of matter within the exposed regions of the two dimensional material to convert the exposed regions to the second composition of matter and form the lateral or vertical heterojunctions according to the specified pattern.

7. The method of claim 1, further comprising:
replacing a single layer of atoms or a plurality of layers of atoms within a crystal lattice of the exposed regions of the two dimensional material in the exposed regions of the two dimensional material.

8. The method of claim 1, further comprising:
converting the exposed regions of the two dimensional material to the second composition of matter to a specified doping level or at a specified rate of deposition.

9. The method of claim 1, wherein the first composition of matter and the second composition of matter comprise semiconductor materials and the lateral or vertical heterojunctions are p-n junctions, n-n junctions or p-p junctions.

10. The method of claim 1, wherein the first composition of matter is a first transition metal dichalcogenide and the second composition of matter is a second transition metal dichalcogenide.

11. The method of claim 1, wherein the first composition of matter is converted to the second composition of matter by replacing chalcogenide atoms or metal atoms in a lattice structure within the exposed regions of the two dimensional material.

12. The method of claim 1, wherein the conversion of the exposed regions of the two dimensional material to a second composition of matter, or converting exposed regions of the converted two dimensional material in further processing steps, is performed by pulsed laser deposition to form the lateral or vertical heterojunctions.

13. The method of claim 1, further comprising:
repeating processing steps comprising:
the specifying of a pattern of masked and exposed regions for constructing lateral or vertical heterojunctions in a two dimensional material, wherein the two dimension material is the converted two dimensional material or a further converted two dimensional material;
the applying an electron beam lithographic mask onto a planar surface of the two dimensional material in selected regions of the planar surface according to the specified pattern of masked and exposed regions; and
the converting of exposed regions of the two dimensional material to a different composition of matter, to form new lateral or vertical heterojunctions according to the specified pattern.

14. The method of claim 13, wherein the conversion of the exposed regions of the two dimensional material to the second composition of matter, or converting the exposed regions of the converted two dimensional material in the repeated processing steps, includes high kinetic energy impingement of atoms in the exposed regions of the two dimensional material or the converted two dimensional material to form the lateral or vertical heterojunctions.

15. The method of claim 13, wherein the two dimensional material, the converted two dimensional material or the further converted two dimensional materials comprises semiconductors, metals or insulators, or a combination thereof.

16. The method of clam 13, further comprising, in repeated processing steps:
applying a second electron beam lithographic mask onto the same planar surface or a planar surface on the opposite side of the two dimensional nanostructure crystal in selected regions according to a second specified pattern of masked and exposed regions; and
converting exposed regions of the same planar surface or the planar surface on the opposite side of the two dimensional material and:
modifying all or a portion of the lateral or vertical heterojunctions;
creating lateral heterojunctions; or
creating vertical heterojunctions.

17. The method of claim 1, further comprising:
repeating processing steps of specifying a pattern of masked and exposed regions onto a planar surface of the two dimensional material, applying an electron beam lithographic mask onto the planar surface according to the specified pattern of masked and exposed regions and converting exposed regions of the two dimensional material to a different composition of matter to form a plurality of lateral heterojunctions or a plurality of vertical heterojunctions in the two dimensional material according to a specified pattern of a respective repeated processing step.

18. The method of claim 13, wherein the two dimensional material is a bilayer crystalline structure and both planar sides of the two dimensional material are converted to a plurality of different compositions of matter during a plurality of processing steps forming lateral heterojunctions and vertical heterojunctions, the lateral and vertical heterojunctions comprising materials of semiconductor, metal, insulator or any combination thereof, and comprising four different compositions of matter.

19. The method of claim 13, wherein the two dimensional material is a trilayer crystal and a second electron beam lithographic mask is applied onto the planar surface on an opposite side of the two dimensional material, and the exposed regions of the planar surface on the opposite side of the two dimensional material are converted to form a plurality of vertical p-n-p or n-p-n heterojunctions and a plurality of lateral heterojunctions within the two dimensional material.

* * * * *